US009041211B2

(12) United States Patent
Uchiyama

(10) Patent No.: US 9,041,211 B2
(45) Date of Patent: May 26, 2015

(54) SEMICONDUCTOR PACKAGE AND METHOD FOR MANUFACTURING THE SEMICONDUCTOR PACKAGE EMBEDDED WITH SEMICONDUCTOR CHIP

(75) Inventor: Kenta Uchiyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 152 days.

(21) Appl. No.: 13/604,912

(22) Filed: Sep. 6, 2012

(65) Prior Publication Data
US 2013/0069245 A1  Mar. 21, 2013

(30) Foreign Application Priority Data

Sep. 21, 2011 (JP) .................... 2011-206550

(51) Int. Cl.
*H01L 23/48* (2006.01)
*H01L 23/52* (2006.01)
(Continued)

(52) U.S. Cl.
CPC ............ *H01L 23/3121* (2013.01); *H01L 24/24* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2924/01029* (2013.01); *H01L 21/568* (2013.01); *H01L 23/562* (2013.01); *H01L 25/0657* (2013.01); *H01L 23/49827* (2013.01); *H01L 24/16* (2013.01); *H01L 24/32* (2013.01); *H01L 24/48* (2013.01); *H05K 1/185* (2013.01); *H01L 2224/16146* (2013.01); *H01L 2224/2929* (2013.01); *H01L 2224/29339* (2013.01); *H01L 2224/29344* (2013.01); *H01L 2224/29355* (2013.01);
(Continued)

(58) Field of Classification Search
USPC ......... 257/687, 686, 698, 701, 702, 706, 707,
257/723–725, 729–730, 736, 790, 773–777
See application file for complete search history.

(56) References Cited

U.S. PATENT DOCUMENTS 6,621,172 B2    9/2003    Nakayama et al.
8,035,217 B2    10/2011   Mori et al.
(Continued)

FOREIGN PATENT DOCUMENTS

JP    2006-222164    8/2006
JP    2007-150346    6/2007
(Continued)

OTHER PUBLICATIONS

Office Action dated Nov. 18, 2014 issued with respect to the basic Japanese Patent Application No. 2011-206550.

Primary Examiner — Chuong A Luu
Assistant Examiner — Cory Eskridge
(74) Attorney, Agent, or Firm — IPUSA, PLLC

(57) ABSTRACT

A semiconductor package includes a first semiconductor chip including a target circuit surface and a side surface, a first sealing insulating layer including a first surface positioned toward the target circuit surface and a second surface positioned opposite to the first surface, the first sealing insulating layer sealing the target circuit surface and the side surface, a wiring layer formed on the first surface of the first sealing insulating layer, an insulating layer formed on the wiring layer, a second semiconductor chip mounted on the second surface of the first sealing insulating layer, and a second sealing insulating layer formed on the second surface and sealing the second semiconductor chip.

9 Claims, 18 Drawing Sheets

(51) Int. Cl.
  *H01L 23/31* (2006.01)
  *H01L 23/00* (2006.01)
  *H01L 21/56* (2006.01)
  *H01L 25/065* (2006.01)
  *H01L 23/498* (2006.01)
  *H05K 1/18* (2006.01)
  *H01L 23/538* (2006.01)
  *H01L 21/683* (2006.01)
  *H05K 3/46* (2006.01)

(52) U.S. Cl.
  CPC ........ *H01L 2224/45144* (2013.01); *H01L 2224/45147* (2013.01); *H01L 2224/81191* (2013.01); *H01L 2224/83192* (2013.01); *H01L 2224/83851* (2013.01); H01L 23/5389 (2013.01); *H05K 3/4682* (2013.01); *H05K 2201/10674* (2013.01); *H05K 2203/1469* (2013.01); H01L 23/49822 (2013.01); H01L 21/6835 (2013.01); *H01L 2221/68345* (2013.01); *H01L 2221/68381* (2013.01); *H01L 2224/05124* (2013.01); *H01L 2224/05147* (2013.01); *H01L 2224/056* (2013.01); *H01L 2224/05624* (2013.01); *H01L 2224/13111* (2013.01); *H01L 2224/13116* (2013.01); *H01L 2224/2919* (2013.01); *H01L 2225/06513* (2013.01); *H01L 2225/06524* (2013.01); *H01L 2225/06548* (2013.01); *H01L 2924/01047* (2013.01); *H01L 2224/48624* (2013.01); *H01L 2224/0401* (2013.01)

(56) References Cited

U.S. PATENT DOCUMENTS

| 2003/0157747 | A1* | 8/2003 | Chen et al. | 438/106 |
| 2008/0111225 | A1* | 5/2008 | Kim et al. | 257/686 |
| 2010/0213605 | A1 | 8/2010 | Shimizu | |
| 2011/0084382 | A1* | 4/2011 | Chen et al. | 257/737 |
| 2011/0221069 | A1 | 9/2011 | Kunimoto | |

FOREIGN PATENT DOCUMENTS

| JP | 2008-306071 | 12/2008 |
| JP | 2009-260165 | 11/2009 |
| JP | 2010-192781 | 9/2010 |
| JP | 2011-187800 | 9/2011 |

* cited by examiner

SEMICONDUCTOR PACKAGE AND METHOD FOR MANUFACTURING THE SEMICONDUCTOR PACKAGE EMBEDDED WITH SEMICONDUCTOR CHIP

CROSS-REFERENCE TO RELATED APPLICATIONS

This application is based upon and claims the benefit of priority of the prior Japanese Patent Application No. 2011-206550 filed on Sep. 21, 2011, the entire contents of which are incorporated herein by reference.

FIELD

The embodiments discussed herein are related to a semiconductor package and a method for manufacturing the semiconductor package; for example, a semiconductor package having a semiconductor chip embedded therein and a method for manufacturing the semiconductor package.

BACKGROUND

Conventionally, there is proposed a semiconductor package having a semiconductor chip embedded therein. For example, the semiconductor package includes a first insulating layer sealing a target circuit surface (i.e. a surface on which a circuit is formed) and a side surface of a semiconductor chip, a first wiring layer formed (layered) on the first insulating layer and electrically connected to an electrode pad of the semiconductor chip, and other insulating layers and wiring layers formed on the first wiring layer.

The semiconductor package may be manufactured by the following steps. First, the first insulating layer is formed by arranging a semiconductor chip on a support member and sealing the target circuit surface and the side surface of the semiconductor chip. Then, a via hole, which exposes an electrode pad of the semiconductor chip, is formed in the first insulating layer. Then, a wiring layer, which is electrically connected to the electrode pad of the semiconductor chip interposed by way of the via hole, is formed on the first insulating layer. Then, for example, one or more other insulating layers and wiring layers are formed on the first wiring layer. Then, by removing the support member, the manufacturing of the semiconductor package is completed.
Patent Document 1: Japanese Laid-Open Patent Publication No. 2008-306071

However, the above-described semiconductor package has a structure in which the semiconductor chip is embedded only in the first insulating layer on a first side of the semiconductor package (with respect to the thickness direction) and only has a layered body including the insulating layer and the wiring layer on a second side of the semiconductor package (with respect to the thickness direction) without having the semiconductor chip embedded therein. This structure may lead to a problem of warping of the semiconductor package.

More specifically, in a case where the main component of the semiconductor chip is silicon, the thermal expansion coefficient of the semiconductor chip is approximately 3.4 ppm/° C., and the Young's modulus of the semiconductor chip is 200 GPa. Meanwhile, in a case where an epoxy type resin is the main component of the first insulating layer or the other insulating layer, the thermal expansion coefficient of the first insulating layer or the other insulating layer is approximately 8-150 ppm/° C. and the Young's modulus of the first insulating layer or the other insulating layer is approximately 0.03-13 GPa. Due to the different values of the physical properties (thermal expansion coefficient, Young's modulus) of the semiconductor package, the side of the semiconductor package having the semiconductor chip embedded in the first insulating layer (i.e. the first side of the semiconductor package) is resistant to deformation due to thermal stress or the like whereas the side of the semiconductor chip having no semiconductor chip embedded (i.e. the second side of the semiconductor package) tends to easily deform due to thermal stress or the like.

As a result, warping of the semiconductor package occurs at room temperature of, for example, approximately 20-30 (in this case, the semiconductor package tends to project toward the first side of the semiconductor package), and warping of the semiconductor chip occurs at a high temperature of, for example, approximately 200-300° C. (in this case, the semiconductor chip tends to become recessed toward the first side of the semiconductor package).

Because the semiconductor chip and layers such as the first insulating layer and the first wiring layer are formed on the substrate member having high rigidity according to the above-described steps for manufacturing the semiconductor package, warping hardly occurs before the removal of the support member. However, the removal of the support member causes loss of balance (unevenness) in the values of the physical properties (e.g., thermal expansion coefficient, Young's modulus) of the semiconductor package. This leads to warping of the semiconductor package.

SUMMARY

According to an aspect of the invention, there is provided a semiconductor package includes a first semiconductor chip including a target circuit surface and a side surface, a first sealing insulating layer including a first surface positioned toward the target circuit surface and a second surface positioned opposite to the first surface, the first sealing insulating layer sealing the target circuit surface and the side surface, a wiring layer formed on the first surface of the first sealing insulating layer, an insulating layer formed on the wiring layer, a second semiconductor chip mounted on the second surface of the first sealing insulating layer, and a second sealing insulating layer formed on the second surface and sealing the second semiconductor chip.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

In the following, embodiments of the present invention are described with reference to the accompanying drawings.

First Embodiment

[Structure of Semiconductor Package of First Embodiment]

Figure 1:
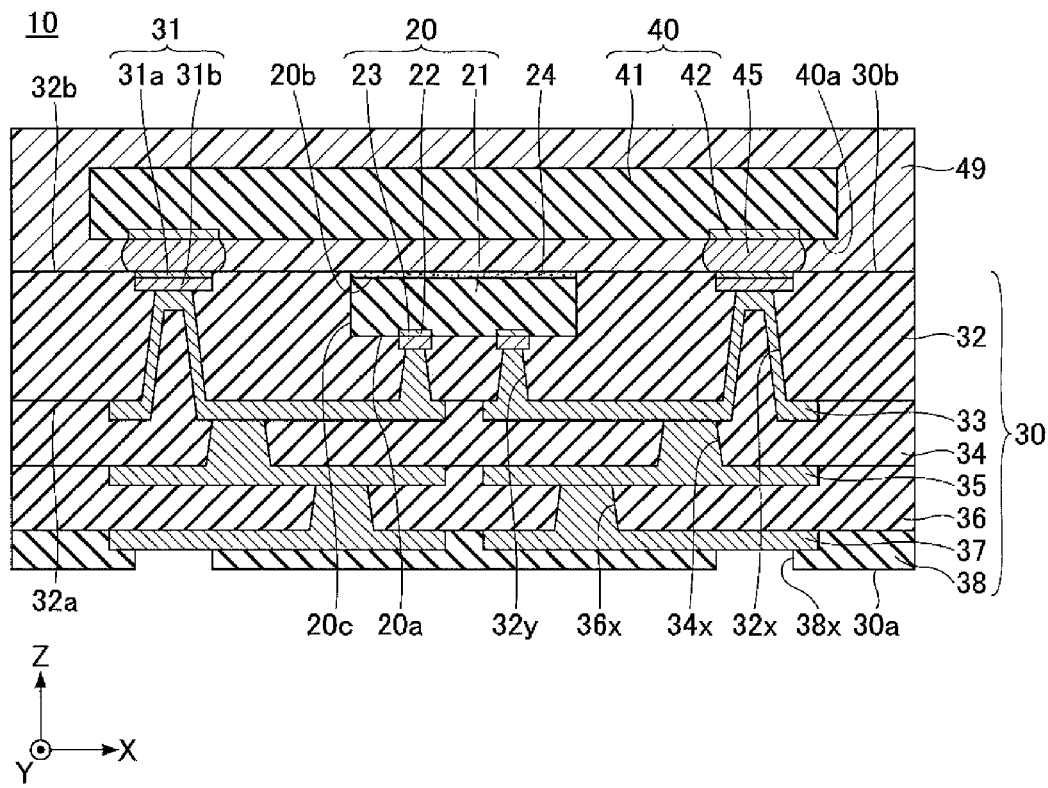
FIG. 1 is a cross-sectional view illustrating a semiconductor package according to a first embodiment of the present invention.
Figure 2:
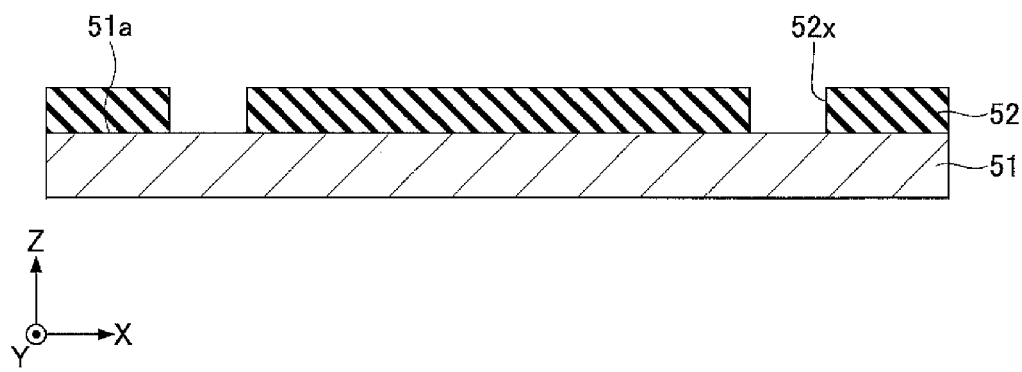
FIGS. 2-14 are schematic diagrams illustrating processes for manufacturing a semiconductor package according to the first embodiment of the present invention.

FIG. 1 is a cross-sectional view illustrating an example of a semiconductor package 10 according to the first embodiment of the present invention. With reference to FIG. 1, the semiconductor package 10 includes, for example, a wiring substrate 30, a semiconductor chip 40, a bonding part 45, and a sealing resin 49.

The wiring substrate 30 is a wiring substrate having a semiconductor chip embedded therein (chip-embedded wiring substrate). The wiring substrate 30 includes, for example, a semiconductor chip 20, a wiring layer 31, an insulating layer 32, a wiring layer 33, an insulating layer 34, a wiring layer 35, an insulating layer 36, a wiring layer 37, and a solder resist layer 38. Reference numeral 30a represents a first main surface of the wiring substrate 30 (hereinafter also referred to as "first main surface 30a"), and reference numeral 30b represents a second main surface of the wiring substrate 30 (hereinafter also referred to as "second main surface 30b"). Further, reference numeral 32a represents the below-described first surface of the insulating layer 32, and reference numeral 32b represents the below-described second surface of the insulating layer 32. Thus, as illustrated in FIG. 1, the second main surface 30b of the wiring substrate 30 includes the second surface 32b of the insulating layer 32 according to an embodiment of the present invention.

The semiconductor package 10 has, for example, a rectangular shape in plan view. The semiconductor package 10 has a size in which the width is, for example, approximately 10 mm (X direction), the depth is, for example, approximately 10 mm (Y direction), and the thickness is, for example, approximately 0.5 mm (Z direction). Next, components (e.g., semiconductor chip 20) constituting the semiconductor package 10 are described in further detail.

The semiconductor chip 20 includes, for example, a semiconductor substrate 21, an electrode pad 22, and a bump (protruding electrode) 23. The semiconductor chip 20 has, for example, a rectangular shape in plan view. The semiconductor chip 20 has a size in which the width is, for example, approximately 5 mm (X direction), the depth is, for example, approximately 5 mm (Y direction), and the thickness is, for example, approximately 100 μm (Z direction).

The semiconductor substrate 21 may be a substrate including, for example, silicon (Si) as a main component and having a semiconductor integrated circuit (not illustrated) formed thereon. The electrode pad 22 is formed on the side of the target circuit surface 20a of the semiconductor substrate (i.e. surface of the semiconductor substrate 21 of the semiconductor chip 20 on which the semiconductor integrated circuit is to be formed). The electrode pad 22 is electrically connected to the semiconductor integrated circuit (not illustrated) of the semiconductor substrate 21. For example, aluminum (Al) may be used as the material of the electrode pad 22. Alternatively, a material having a copper (Cu) layer and an aluminum (Al) layer layered in this order or a material having a copper (Cu) layer, an aluminum (Al) layer, and a silicon (Si) layer layered in this order may be used as the material of the electrode pad 22.

The bump 23 is formed on a surface of the electrode pad 22 toward the first main surface 30a (hereinafter also referred to as "first surface of electrode pad 22"). For example, a copper post having a pillar shape may be used as the bump 23. The diameter of the bump 23 may be, for example, approximately 50 μm. The height of the bump 23 may be, for example, approximately 5-10 μm. The pitch between the bumps 23 may be, for example, approximately 100 μm. It is to be noted that the bump 23 does not necessarily have to be formed on the first surface of the electrode pad 22. In a case where the bump 23 is not formed on the first surface of the electrode pad 22, the electrode pad 22 itself serves as an electrode to be electrically connected to the wiring layer 33.

The surface of the semiconductor chip 20, which is on the opposite side of the target circuit surface 20a and substantially parallel to the target circuit surface, may be hereinafter referred to as a "rear surface" 20b of the semiconductor chip 20. Further, the surface of the semiconductor chip 20, which is substantially perpendicular to the target circuit surface 20a and the rear surface 20b of the semiconductor chip 20, may be hereinafter referred to as a "side surface" 20c of the semiconductor chip 20.

The target circuit surface 20a and the side surface 20c of the semiconductor chip 20 are sealed by the insulating layer 32. An adhesive layer 24 (e.g., die attach film) is exposed on the rear surface of the semiconductor chip 20. The adhesive layer 24, which is adhered to the rear surface of the semiconductor chip 20, is substantially flush with a surface of the insulating layer 32 toward the second main surface 30b (hereinafter also referred to as "second surface 32b of insulating layer 32"). Because the thickness of the adhesive layer 24 is approximately a few 10 s of micrometers (μm), the rear surface of the semiconductor chip 20 may be considered to be substantially flush with the second surface 32b of the insulating layer 32.

Although FIG. 1 illustrates a state where the adhesive layer 24 is adhered to the rear surface of the semiconductor chip 20, the adhesive layer 24 may be removed by, for example, a plasma process. In the case where the adhesive layer 24 is removed, the rear surface of the semiconductor chip 20 is exposed on the insulating layer 32.

The wiring layer 31 includes first and second layers 31a, 31b. For example, the first layer 31a may be a conductive layer including a gold (Au) film, a palladium (Pd) film, and a nickel (Ni) film layered in this order and having the gold (Au) film positioned toward the bonding part 45. Alternatively, the first layer 31a may be a conductive layer including a gold (Au) film and a nickel (Ni) film layered in this order and having the gold (Au) film positioned toward the bonding part 45. For example, the second layer 31b may be a conductive layer such as a copper layer. The thickness of the wiring layer 31 may be, for example, approximately 10 μm to 20 μm.

A part of the wiring layer 31 (a surface of the first layer 31a toward the second main surface 30b, hereinafter also referred to as "second surface of the first layer 31a") is exposed on the insulating layer 32 and is substantially flush with the second surface 32b of the insulating layer 32 and the rear surface of the semiconductor chip 20. The part of the wiring layer 31 (second surface of the first layer 31a) functions as an electrode pad which is electrically connected to the semiconductor chip 40. The part of the wiring layer 31 exposed on the insulating layer 32 may hereinafter be referred to as "first electrode pad 31".

The number of first electrode pads 31 illustrated in FIG. 1 is reduced for the sake of convenience. The actual first electrode pads 31 are arranged in plural rows and encompass the rear surface of the semiconductor chip 20 in a frame-like shape from plan view. The first electrode pad 31 has, for example, a circular shape from plan view. The diameter of the circular-shaped first electrode pad 31 may be, for example, approximately 100 µm to 350 µm. The pitch between first electrode pads 31 may be, for example, approximately 400 µm to 500 µm.

The insulating layer 32 seals a surface of the wiring layer 31 toward the first main surface 30a (hereinafter also referred to as "first surface of the wiring layer 31") and side surfaces of the wiring layer 31 along with the target circuit surface 20a and the side surface 20c of the semiconductor chip 20. A surface of the wiring layer 31 toward the second main surface 30b (hereinafter also referred to as "second surface of the wiring layer 31") and the rear surface of the semiconductor chip 40 are exposed on the insulating layer 32. An insulating resin having a thermosetting property may be used as the material of the insulating layer 32. For example, a material having an epoxy type resin or a phenol type resin as a main component may be used as the material of the insulating layer 32. The thickness of the insulating layer 32 may be, for example, approximately 150 µm. The insulating layer 32 may include a filler such as silica ($SiO_2$). The insulating layer 32 is a representative example of the first sealing insulating layer according to an embodiment of the present invention.

A via hole 32x, which penetrates the insulating layer 32 and exposes the first surface of the wiring layer 31, is formed in the insulating layer 32. Further, a via hole 32y, which penetrates the insulating layer 32 and exposes a surface of the bump 23 toward the first main surface 30a (hereinafter also referred to as "first surface of the bump 23"), is also formed in the insulating layer 32. In this embodiment, the via hole 32x is a recess having a shape of a circular truncated cone. The via hole 32x has an opening part toward the insulating layer 34 and a bottom surface part on the first surface of the wiring layer 31. The area of the opening part of the via hole 32x is larger than the area of the bottom surface part of the via hole 32x. The diameter of the opening part of the via hole 32x may be, for example, approximately 150 µm.

The via hole 32y is a recess having a shape of a circular truncated cone. The via hole 32y has an opening part toward the insulating layer 34 and a bottom surface part on the first surface of the bump 23. The area of the opening part of the via hole 32y is larger than the area of the bottom surface part of the via hole 32y. The diameter of the opening part of the via hole 32y may be, for example, approximately 30 µm.

The wiring layer 33 is formed on a surface of the insulating layer 32 toward the first main surface 30a (hereinafter also referred to as "first surface 32a of insulating layer 32"). The wiring layer 33 includes a first via wiring (penetration wiring), a second via wiring (penetration wiring), and a wiring pattern. The first via wiring is formed on a sidewall of the via hole 32x and the first surface of the wiring layer 31. The second via wiring fills the inside of the via hole 32y. The wiring pattern of the wiring layer 33 is formed on a surface of the insulating layer 32 toward the first main surface 30a (hereinafter also referred to as "first surface 32a of insulating layer 32").

The wiring layer 33 is electrically connected to the wiring layer 31 exposed on the bottom surface part of the via hole 32x and the bump 23 exposed in the via hole 32y. For example, a metal material having copper (Cu) as a main component may be used as the material of the wiring layer 33. The thickness of the wiring pattern of the wiring layer 33 may be, approximately 10 µm to 20 µm.

For example, in a case where the thickness of the insulating layer 32 is 150 µm, and the thickness of the wiring layer 31 is 10 µm, the depth of the via hole 32x would be 140 µm. The depth of the via hole 32x in this case makes it difficult to fill the inside of the via hole 32x with the first via wiring. Therefore, rather than filling the inside of the via hole 32x with the first via wiring, the first via wiring is formed as a film that only covers the sidewall of the via hole 32x and the first surface of the wiring layer 31. On the other hand, in a case where the thickness of the insulating layer 32 is 150 µm, and the thickness of the semiconductor chip 20 (including the height of the bump 23), the depth of the via hole 32y would be 50 µm. The depth of the via hole 32y is significantly shallower than the depth of the via hole 32x. Therefore, the second via wiring fills the inside of the via hole 32y.

The insulating layer 34 is formed on the first surface 32a of the insulating layer 32 and covers the wiring layer 33. For example, the same insulating resin used for the insulating layer 32 may be used as the material of the insulating layer 34. The thickness of the insulating layer 34 may be, for example, approximately 15 µm to 35 µm. The insulating layer 34 may include a filler such as silica ($SiO_2$).

The wiring layer 35 is formed on a surface of the insulating layer 34 toward the first main surface 30a (hereinafter also referred to as "first surface of the insulating layer 34"). The wiring layer 35 includes a via wiring and a wiring pattern. The via wiring of the wiring layer 35 penetrates the insulating layer 34 and fills the inside of a via hole 34x exposed on a first surface of the wiring layer 33 (hereinafter referred to as "first surface of wiring layer 33"). The via hole 34x is a recess having a shape of a circular truncated cone. The via hole 34x has an opening part toward the insulating layer 36 and a bottom surface part on the first surface of the wiring layer 33. The area of the opening part of the via hole 34x is larger than the area of the bottom surface part of the via hole 34x. A via wiring is formed inside the recess of the via hole 34x.

The wiring layer 35 is electrically connected to the wiring layer 33 exposed in the via hole 34x. For example, a metal material having copper (Cu) as a main component may be used as the material of the wiring layer 35. The thickness of the wiring pattern of the wiring layer 35 may be, for example, approximately 10 µm to 20 µm.

The insulating layer 36 is formed on the first surface of the insulating layer 34 and covers the wiring layer 35. For example, the same insulating resin used for the insulating layer 32 may be used as the material of the insulating layer 36. The thickness of the insulating layer 36 may be, for example, approximately 15 µm to 35 µm. The insulating layer 36 may include a filler such as silica ($SiO_2$).

The wiring layer 37 is formed on a surface of the insulating layer 36 toward the first main surface 30a (hereinafter also referred to as "first surface of the insulating layer 36"). The wiring layer 37 includes a via wiring and a wiring pattern. The via wiring of the wiring layer 37 penetrates the insulating layer 36 and fills the inside of a via hole 36x exposing a surface of the wiring layer 35 toward the first main surface (hereinafter also referred to as "first surface of the wiring layer 35"). The wiring pattern of the wiring layer 37 is formed on the first surface of the insulating layer 36. The via hole 36x is a recess having a shape of a circular truncated cone. The via hole 36x has an opening part toward the solder resist layer 38 and a bottom surface part on the first surface of the wiring layer 35. The area of the opening part of the via hole 36x is larger than the area of the bottom surface part of the via hole 36x. The via wiring of the wiring layer 37 is formed inside the recess of the via hole 36x.

The wiring layer 37 is electrically connected to the wiring layer 35 exposed in the via hole 36x. For example, a metal material having copper (Cu) as a main component may be used as the material of the wiring layer 37. The thickness of the wiring pattern of the wiring layer 37 may be, for example, approximately 10 µm to 20 µm.

The solder resist layer 38 is formed on the first surface of the insulating layer 36 and covers the wiring layer 37. The thickness of the solder resist layer 38 may be, for example, approximately 15 µm to 35 µm. The solder resist layer 38 may include a filler such as silica ($SiO_2$). The solder resist layer 38 includes an opening part 38x having a bottom part that exposes a part of the wiring layer 37.

The part of the wiring layer 37, which is exposed in the opening part 38x, functions as an electrode pad that is electrically connected to, for example, another semiconductor package, another semiconductor chip, a mounting board (e.g., motherboard), or an electronic component. The part of the wiring layer 37 exposed in the opening part 38x may hereinafter be referred to as a "second electrode pad 37". The second electrode pad 37 has, for example, a circular shape from plan view. The diameter of the circular-shaped second electrode pad 37 may be, for example, approximately 100 µm to 350 µm. The pitch between the second electrode pads 37 may be, for example, approximately 400 µm to 500 µm.

A metal layer may be formed on a surface of the second electrode pad 37 toward the first main surface (hereinafter also referred to as "first surface of the metal layer" according to necessity). The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). It is to be noted that the solder resist layer 38 may be simply referred to as an insulating layer.

The semiconductor chip 40 includes a semiconductor substrate 41 and an electrode pad 42. The semiconductor chip 40 has, for example, a rectangular shape in plan view. The semiconductor chip 40 has a size in which the width is, for example, approximately 8 mm (X direction), the depth is, for example, approximately 8 mm (Y direction), and the thickness is, for example, approximately 200 µm (Z direction).

The semiconductor substrate 41 may be a substrate having, for example, silicon (Si) as a main component and having a semiconductor integrated circuit (not illustrated) formed thereon. The electrode pad 42 is formed on the side of the target circuit surface 40a of the semiconductor substrate (i.e. surface of the semiconductor substrate 41 of the semiconductor chip 40 on which the semiconductor integrated circuit is to be formed). The electrode pad 42 is electrically connected to the semiconductor integrated circuit (not illustrated) of the semiconductor substrate 41. The pitch between the electrode pads 42 may be, for example, approximately 100 µm.

For example, aluminum (Al) may be used as the material of the electrode pad 42. Alternatively, a material having a copper (Cu) layer and an aluminum (Al) layer layered in this order or a material having a copper (Cu) layer, an aluminum (Al) layer, and a silicon (Si) layer layered in this order may be used as the material of the electrode pad 42.

The semiconductor chip 40 is mounted on the second main surface 30b of the wiring substrate 30 in a state facing downward (i.e. a state having the target circuit surface facing downward). More specifically, the electrode pad 42 of the semiconductor chip 40 is electrically connected to the first electrode pad 31 of the wiring substrate 30 by way of the bonding part 45.

The bonding part 45 may be, for example, a solder ball. For example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu) may be used as the material of the solder ball.

The sealing resin 49 is formed covering the semiconductor chip 40 and the bonding part 45. In order to improve the heat releasing property of the semiconductor chip 40, the rear surface (i.e. surface opposite to target circuit surface) of the semiconductor chip 40 may be exposed from the sealing resin 49. For example, an insulating resin (mold resin) such as an epoxy type resin having a thermosetting property or a polyimide type resin may be used as the material of the sealing resin 49. The sealing resin 49 may include a filler such as silica ($SiO_2$). The thickness of the sealing resin 49 may be, for example, 300 µm to 400 µm. The sealing resin 49 is a representative example of the second sealing insulating layer according to an embodiment of the present invention.

The semiconductor package 10 has a structure in which the semiconductor chips 20, 40 are arranged in the vicinity of a center part of the semiconductor package 10 in a thickness direction of the semiconductor package 10, and corresponding resin layers (e.g., insulating layer 32, sealing resin 49) are arranged at an outer side of the semiconductor chips 20, 40. In other words, the semiconductor package 10 has a structure in which the values of the physical properties (e.g., thermal expansion coefficient, Young's modulus) between the upper and lower sides of the semiconductor package 10 can be balanced. Owing to the structure of the semiconductor package 10, the generation of warping due to, for example, thermal stress can be reduced.

Particularly, by forming the wiring substrate 30 and the sealing resin 49 with substantially the same thickness, a well-balanced structure can be obtained for the semiconductor package 10 in which the values of the physical properties (e.g., thermal expansion coefficient, Young's modulus) between the upper and lower sides of the semiconductor package 10 are balanced. Thereby, generation of warping due to, for example, thermal stress can be significantly reduced. That is, if the proportion of the thickness of either the wiring substrate 30 or the sealing resin 49 is within a range of approximately 40-60% with respect to the thickness of the entire semiconductor package (i.e. total thickness obtained by combining the thickness of the wiring substrate 30 and the thickness of the sealing resin 49), warping can be significantly reduced.

Because FIG. 1 does not illustrate the thicknesses of, for example, the insulating layer 32 and the sealing resin 49 in accordance with the actual proportion of thicknesses of the insulating layer 32 and the sealing resin 49 for the sake of convenience, the thickness of the wiring substrate 30 and the thickness of the sealing resin 49 may be considered to be significantly different. However, the thickness of the sealing resin 49 can be matched with the thickness of the wiring layer 30 because the sealing resin 49 is formed by using, for example, a transfer molding method. Therefore, the wiring substrate 30 and the sealing resin 49 can easily be formed having a substantially equal thickness.

[Method for Manufacturing Semiconductor Package According to First Embodiment]

Next, a method for manufacturing the semiconductor package 10 according to the first embodiment of the present invention is described. FIGS. 2-14 are schematic diagrams illustrating the processes for manufacturing the semiconductor package 10 according to the first embodiment of the present invention. It is to be noted that FIGS. 3-13 illustrate a state in which the wiring substrate 30 or a part of the wiring substrate 30 is flipped vertically (i.e. upside down) with respect to the example illustrated in FIG. 1. In FIGS. 3-13, the side of the semiconductor package 10 toward the first main surface 30a of FIG. 1 is described as a lower side (side of lower surface) of the semiconductor package 10 and the side of the semiconductor package 10 toward the second main surface 30b is described as an upper side (side of upper surface) of the semiconductor package 10 for the sake of convenience.

First, the wiring substrate 30 is manufactured by performing the steps illustrated in FIGS. 2-10. In the process illustrated in FIG. 2, a supporting member 51 is prepared. A resist layer 52 is formed on the first surface 51a of the supporting member 51. The resist layer 52 includes an opening part 52x that corresponds to the wiring layer 31. Although a silicon board, a glass board, a metal board, or a metal foil may be used to form the supporting member 51, copper foil is used in this embodiment. Copper foil is used because the copper foil can be used as a power feeding layer when performing electroplating in the below-described subsequent process illustrated in FIG. 3, and because the copper foil can easily be removed in the below-described subsequent process illustrated in FIG. 13. The thickness of the supporting member 51 may be, for example, approximately 35 μm to 100 μm.

In order to form the resist layer 52 having the opening part 52x, a liquid or paste-like resin formed of a photosensitive resin compound is applied to the first surface 51a of the supporting member 51. The photosensitive resin compound of the liquid or paste-like resist may include, for example, an epoxy type resin or an acrylic type resin. Alternatively, a film-like resin (e.g., dry film resist) formed of a photosensitive resin compound may be laminated on the first surface 51a of the supporting member 51. The photosensitive resin compound of the film-like resin may include, for example, an epoxy type resin or an acrylic type resin.

Then, the opening part 52x is formed by exposing and developing the applied or laminated photosensitive resin compound. Thereby, the resist layer 52 having the opening part 52x is formed. Alternatively, a film-like resist including the opening part 52x formed beforehand may be laminated on the first surface 51a of the supporting member 51. The opening part 52x is formed in a position corresponding to a position at which the wiring layer 31 is formed in the below-described process illustrated in FIG. 3. The opening part 52x may have, for example, a circular shape from plan view. The diameter of the circular-shaped opening part 52x may be, for example, approximately 100 μm to 350 μm.

Figure 3:
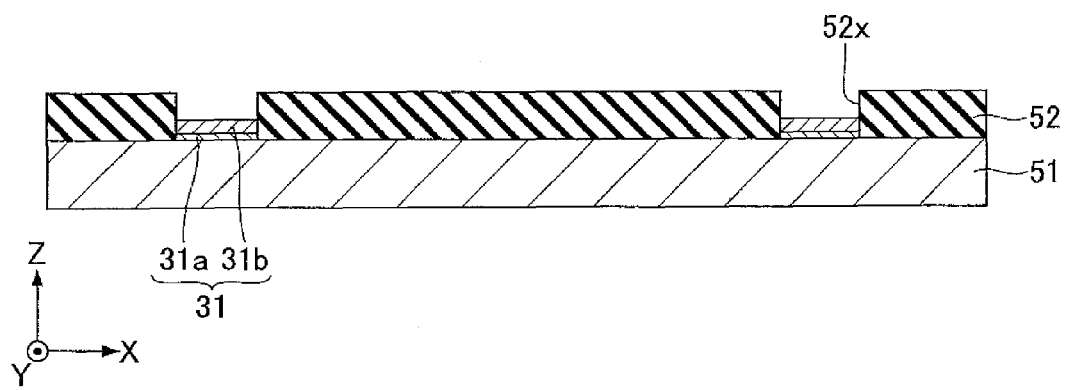

Then, in the process illustrated in FIG. 3, the wiring layer 31 including the first and second layers 31a, 31b is formed in the opening part 52x of the first surface 51a of the supporting member 51 by performing, for example, an electroplating method using the supporting member 51 as the power feeding layer. The first layer 31a may have a layered structure having a gold (Au) film, a palladium (Pd) film, and a nickel (Ni) film layered in this order.

Therefore, first, in order to form the wiring layer 31, the first layer 31a having the layered structure is formed by performing, for example, an electroplating method using the supporting member 51 as the power feeding layer. In forming the layered structure of the wiring layer 31, a gold (Au) film, a palladium (Pd) film, and a nickel (Ni) film are plated in this order. Then, the second layer 31b is formed on the first layer 31a by, performing, for example, an electroplating method using the supporting member 51 as the power feeding layer. The second layer 31b may be formed of, for example, copper (Cu). Alternatively, the first layer 31a may have a layered structure having a gold (Au) film and a nickel (Ni) film layered in this order.

Figure 4:
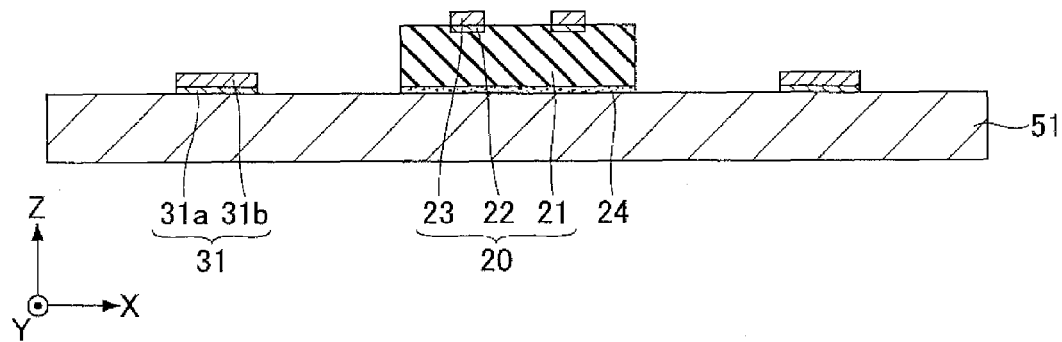

Then, in the process illustrated in FIG. 4, the semiconductor chip 20 is prepared. After the resist layer 52 illustrated in FIG. 3 is removed, the semiconductor chip 20 is formed on the first surface 51a of the supporting member 51 interposed by the adhesive layer 24 (e.g., die attach film). As illustrated in FIG. 4, the semiconductor chip 20 is formed in a state facing upward (i.e. a state having the target circuit surface 20a facing upward). The semiconductor chip 20 includes, for example, the semiconductor substrate 21, the electrode pad 22, and the bump 23. The electrode pad 22 and the bump 23 are formed on the side of the target circuit surface 20a of the semiconductor chip 20. The thickness of the semiconductor chip 20 may be reduced to a thickness of, for example, approximately 100 μm.

Figure 5:
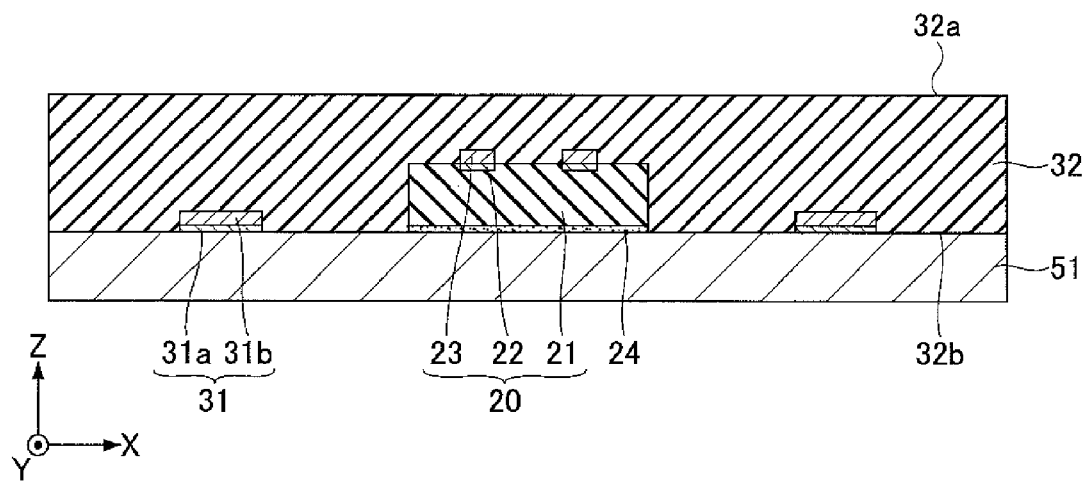

Then, in the process illustrated in FIG. 5, the insulating layer 32 is formed on the first surface 51a of the supporting member 51. The insulating layer 32 covers the target circuit surface 20a and the side surface 20c of the semiconductor chip 20 and the upper and side surfaces of the wiring layer 31. An insulating resin having a thermosetting property may be used as the material of the insulating layer 32. For example, a material having an epoxy type resin or a phenol type resin as a main component may be used as the material of the insulating layer 32. The thickness of the insulating layer 32 may be, for example, approximately 150 μm. The insulating layer 32 may include a filler such as silica ($SiO_2$).

In a case where, for example, a film-like thermosetting insulating resin having an epoxy type resin or a phenol type resin as a main component is used as the material of the insulating layer 32, the insulating layer 32 is formed as follows. An insulating resin film being in a semi-cured state is laminated on the first surface 51a of the supporting member 51. The laminated insulating resin covers the target circuit surface 20a and the side surface 20c of the semiconductor chip 20 and the upper and side surfaces of the wiring layer 31. Then, the laminated insulating resin is cured by applying a pressing force to the laminated resin while heating the laminated insulating resin to a temperature greater than or equal to a thermosetting temperature. Thereby, the insulating layer 32 is formed. It is to be noted that generation of voids can be prevented by laminating the insulating resin in a vacuum atmosphere.

In a case where, for example, a liquid or a paste-like thermosetting insulating resin having an epoxy type resin or a phenol type resin as a main component is used as the material of the insulating layer 32, the insulating layer 32 is formed as follows. An insulating resin liquid or paste is applied on the first surface 51a of the supporting member 51 by using, for example, a roll-coating method. The applied insulating resin covers the target circuit surface 20a and the side surface 20c of the semiconductor chip 20 and the upper and side surfaces of the wiring layer 31. Then, the applied insulating resin is cured by heating the applied insulating resin to a temperature greater than or equal to a thermosetting temperature. Thereby, the insulating layer 32 is formed.

Figure 6:
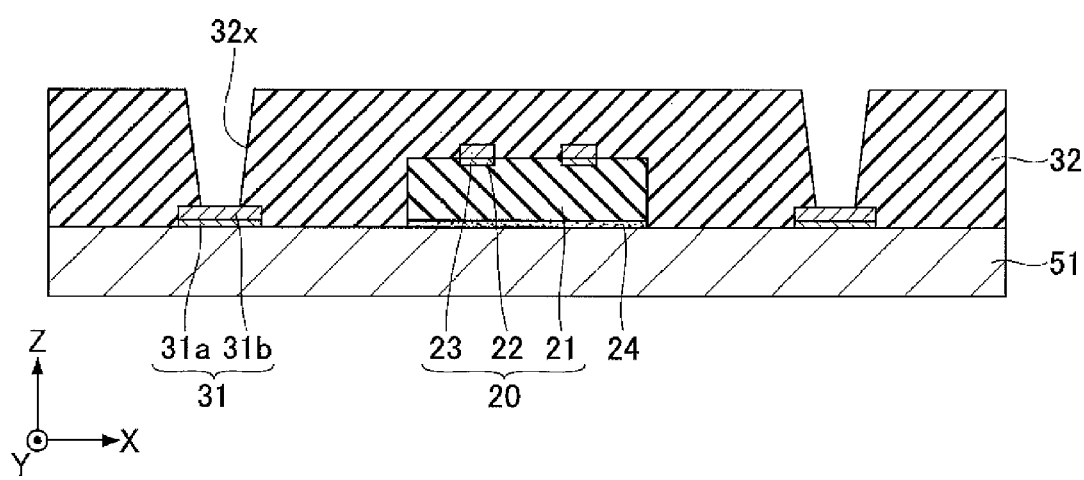

Then, in the process illustrated in FIG. 6, the via hole 32x, which penetrates the insulating layer 32 and exposes the upper surface of the wiring layer 31, is formed in the insulating layer 32. The via hole 32x may be formed by, for example, a laser processing method using a $CO_2$ laser. The via hole 32x formed by the laser processing method is a recess having a shape of a circular truncated cone. The via hole 32x has an opening part toward the insulating layer 34 and a bottom surface part on the upper surface of the wiring layer 31. The area of the opening part of the via hole 32x is larger than the area of the bottom surface part of the via hole 32x. The diameter of the opening part of the via hole 32x may be, for example, approximately 150 µm.

Figure 7:
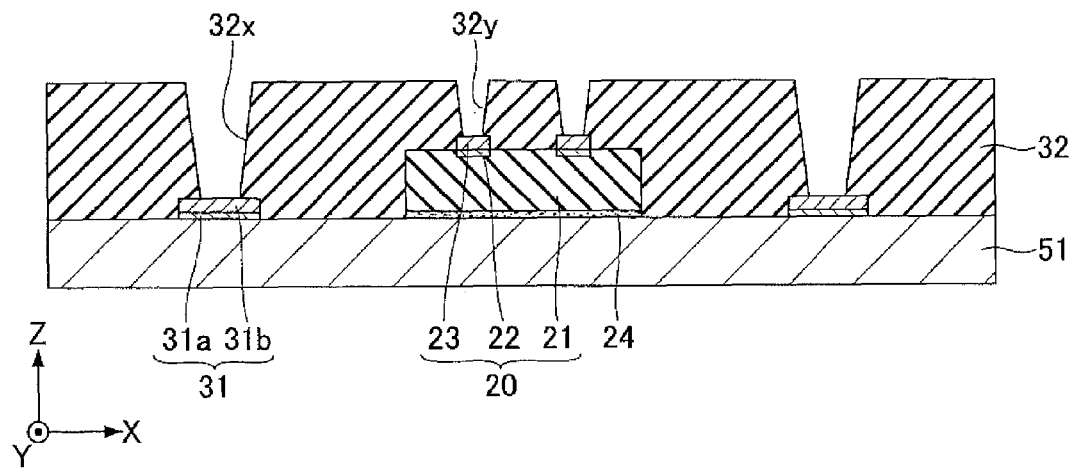

Then, in the process illustrated in FIG. 7, the via hole 32y, which penetrates the insulating layer 32 and exposes the upper surface of the bump 23, is formed in the insulating layer 32. The via hole 32y may be formed by, for example, a laser processing method using a UV (Ultra-Violet) laser. The via hole 32y formed by the laser processing method is a recess having a shape of a circular truncated cone. The via hole 32y has an opening part toward the insulating layer 34 and a bottom surface part on the upper surface of the bump 23. The area of the opening part of the via hole 32y is larger than the area of the bottom surface part of the via hole 32y. The diameter of the opening part of the via hole 32y may be, for example, approximately 30 µm.

In a case where the via holes 32x, 32y are formed by using the laser processing method, it is preferable to remove residual resin of the insulating layer 32 adhered to the upper surface of the wiring layer 31 (exposed on the bottom surface part of the via hole 32x) and the upper surface of the bump 23 (exposed on the bottom surface part of the via hole 32y). Therefore, in this case, a desmearing process may be used to remove the residual resin of the insulating layer 32.

Figure 8:
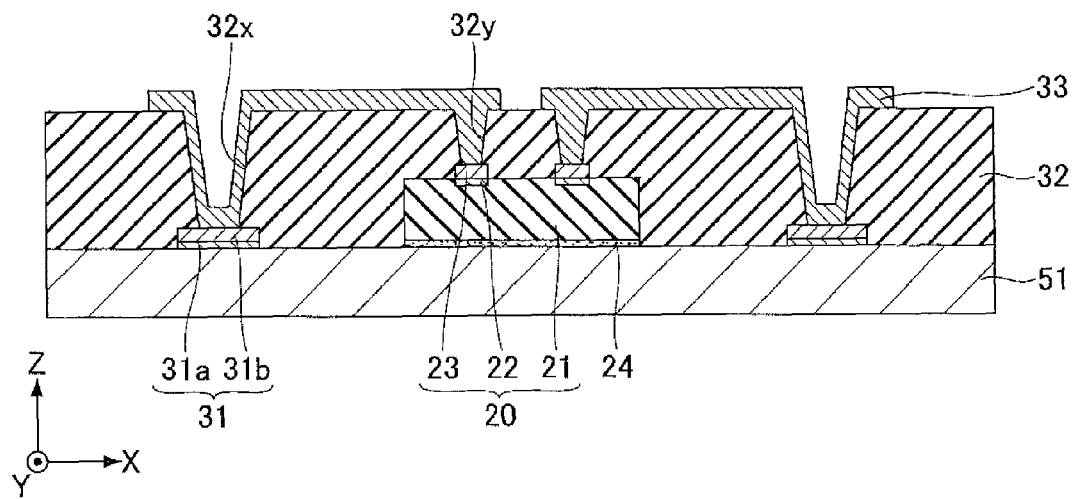

In the process illustrated in FIG. 8, the wiring layer 33 is formed on the insulating layer 32. The wiring layer 33 includes first and second via wirings, and a wiring pattern. The first via wiring is formed on the sidewall of the via hole 32x and the upper surface of the wiring layer 32. The second via wiring fills the inside of the via hole 32y. The wiring pattern of the wiring layer 33 is formed on the insulating layer 32. The wiring layer 33 is electrically connected to the wiring layer 31 exposed on the bottom surface part of the via hole 32x and the bump 23 exposed on the bottom surface part of the via hole 32y.

For example, a metal material having copper (Cu) as a main component may be used as the material of the wiring layer 33. The thickness of the wiring pattern of the wiring layer 33 may be, approximately 10 µm to 20 µm. As described above, due to, for example, the difficulty of filling the inside of the via hole 32x with the first via wiring, the first via wiring does not substantially completely fill the via hole 32x whereas the second via wiring does substantially completely fill the via hole 32y.

Although the wiring layer 33 may be formed by using various wiring forming methods (e.g., semi-additive method, subtractive method), an example of forming the wiring layer 33 with the semi-additive method is described below.

First, a seed layer (not illustrated) is formed on the upper surface of the wiring layer 31 exposed in the via hole 32x, the upper surface of the bump 23 exposed in the via hole 32y, and the insulating layer 32 including the sidewalls of the via holes 32x, 32y. For example, a seed layer, that is formed of a metal material having copper (Cu) as a main component, may be formed by performing an electroless plating method or a sputtering method. Then, a resist layer (not illustrated) having an opening part corresponding to the wiring layer 33 is formed on the seed layer.

Then, a wiring layer (not illustrated), that is formed of a metal material having copper (Cu) as a main component, is formed in the opening part of resist layer. The wiring layer is formed by an electroplating method using the seed layer as the power feeding layer. Then, after removing the resist layer, a part of the seed layer that is not covered by the wiring layer is removed by using the wiring layer as a mask and etching the part of the seed layer that is not covered by the wiring layer. Thereby, the wiring layer 33 including the first via wiring (having been formed on the sidewall of the via hole 32x and the upper surface of the wiring layer 31), the second via wiring (filling the inside of the via hole 32y), and the wiring pattern (having been formed on the insulating layer 32) is formed.

Figure 9:
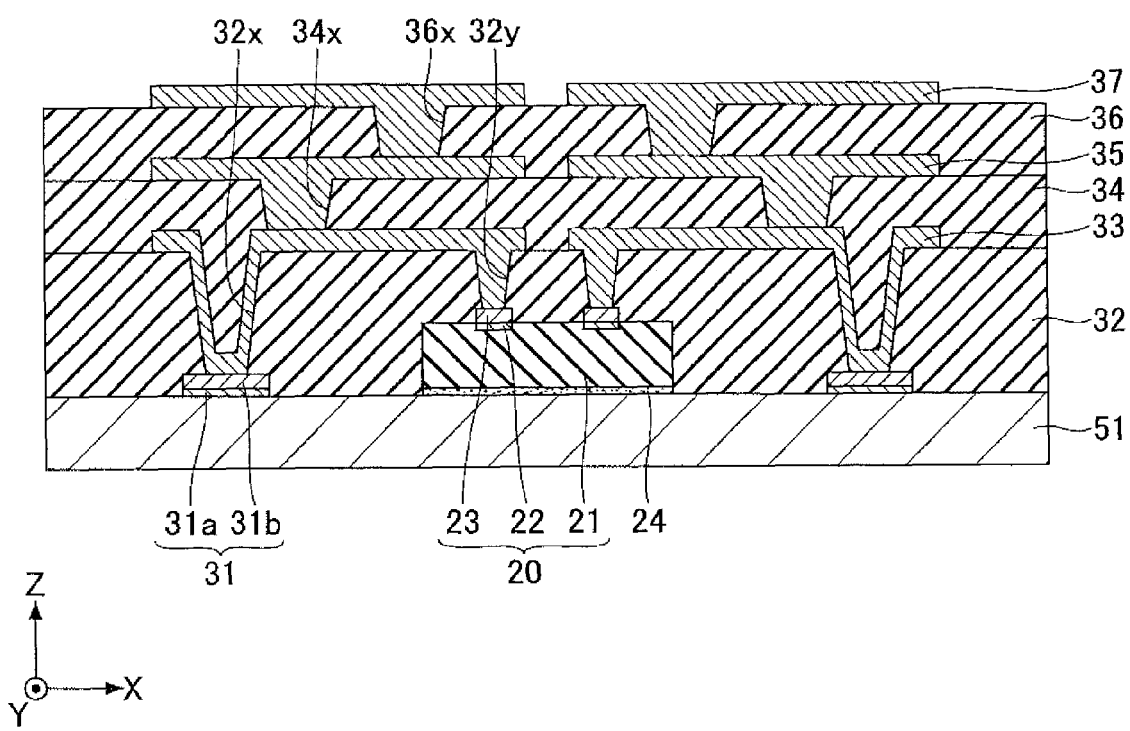

Then, in the process illustrated in FIG. 9, by repeating the above-described processes illustrated in FIGS. 2-8, the insulating layer 34, the wiring layer 35, the insulating layer 36, and the wiring layer 37 are layered on the insulating layer 32 as illustrated in FIG. 9. That is, the via hole 34x, which penetrates the insulating layer 34 and exposes the upper surface of the wiring layer 33, is formed after the insulating layer 34 covering the wiring layer 33 is formed on the insulating layer 32. The material of the insulating layer 34 may be the same insulating resin used for forming the insulating layer 32. The thickness of the insulating layer 34 may be, for example, approximately 15 µm to 35 µm. The insulating layer 34 may include a filler such as silica ($SiO_2$).

Then, the wiring layer 35 is formed on the insulating layer 34. The wiring layer 35 is connected to the wiring layer 33 by way of the via hole 34x. The wiring layer 35 includes a via wiring that fills the inside of the via hole 34x and the wiring layer that is formed on the insulating layer 34. The wiring layer 35 is electrically connected to the wiring layer 33 exposed in the bottom surface part of the via hole 34x. For example, a metal material having copper (Cu) as a main component may be used as the material of the wiring layer 35. The wiring layer 35 may be formed by using, for example, a semi-additive method. The thickness of the wiring pattern of the wiring layer 35 may be, for example, approximately 10 µm to 20 µm.

Then, the via hole 36x, which penetrates the insulating layer 36 and exposes the upper surface of the wiring layer 35, is formed after the insulating layer 36 covering the wiring layer 35 is formed on the insulating layer 34. The material of the insulating layer 36 may be the same insulating resin used for forming the insulating layer 34. The thickness of the insulating layer 36 may be, for example, approximately 15 µm to 35 µm. The insulating layer 36 may include a filler such as silica ($SiO_2$).

Then, the wiring layer 37 is formed on the insulating layer 36. The wiring layer 37 is connected to the wiring layer 35 by way of the via hole 36x. The wiring layer 37 includes a via wiring that fills the inside of the via hole 36x and the wiring layer that is formed on the insulating layer 36. The wiring layer 37 is electrically connected to the wiring layer 35 exposed in the bottom surface part of the via hole 36x. For example, a metal material having copper (Cu) as a main component may be used as the material of the wiring layer 37. The wiring layer 37 may be formed by using, for example, a semi-additive method. The thickness of the wiring pattern of the wiring layer 37 may be, for example, approximately 10 µm to 20 µm.

Thereby, a predetermined built-up wiring structure is formed on the first surface 51a of the supporting member 51.

Although a built-up wiring structure including 3 layers (wiring layers 33, 35, and 37) is formed in the above-described embodiment, a built-up wiring structure including n layers ("n" being an integer greater than or equal to 1) may be formed.

Figure 10:
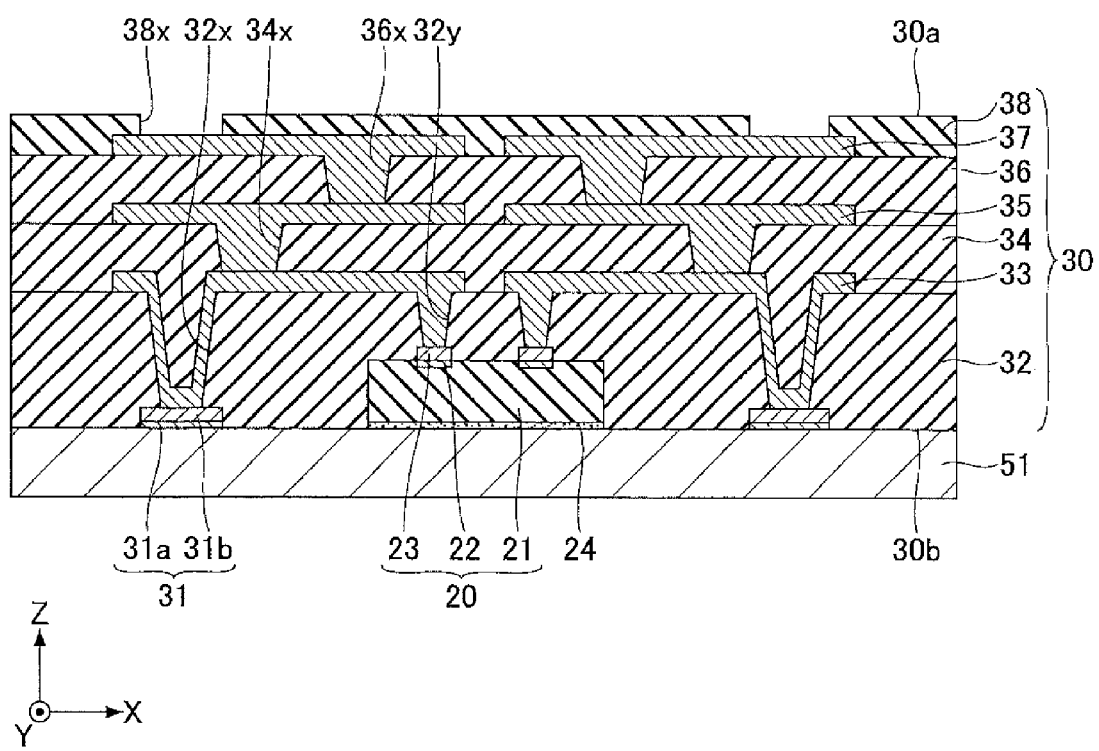

Then, in the process illustrated in FIG. 10, the solder resist layer 38 having the opening part 38x (which exposes a part of the wiring layer 37) is formed on the insulating layer 36. Thereby, the manufacturing of the wiring substrate 30 is completed. The solder resist layer 38 is formed covering the wiring layer 37 by applying a liquid or paste-like photosensitive insulating resin (e.g., epoxy type resin, acrylic type resin) on the insulating layer 36 by using a screen-printing method, a roll-coating method, or a spin-coating method. Alternatively, the solder resist layer 38 may be formed covering the wiring layer 37 by laminating a film-like photosensitive insulating resin (e.g., epoxy type resin, acrylic type resin) on the insulating layer 36.

The opening part 38x can be formed by exposing and developing the applied or laminated insulating resin (photolithographic method). Alternatively, a film-like insulating resin having the opening part 38x formed beforehand may be laminated on the insulating layer 36 and cover the wiring layer 37. Alternatively, a non-photosensitive insulating resin may be used as the material of the solder resist layer 38. In the case where the non-photosensitive insulating resin is used, the opening part 38x is formed by, for example, using a laser processing method using $CO_2$ laser or performing a blasting process using a polishing agent (e.g., alumina abrasive grain) after the solder resist layer 38 is formed on the insulating layer 36 and cured.

According to necessity, a metal layer may be formed on the wiring layer 37 exposed in the bottom surface part of the opening part 38x by using, for example, an electroless plating method. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Figure 11:
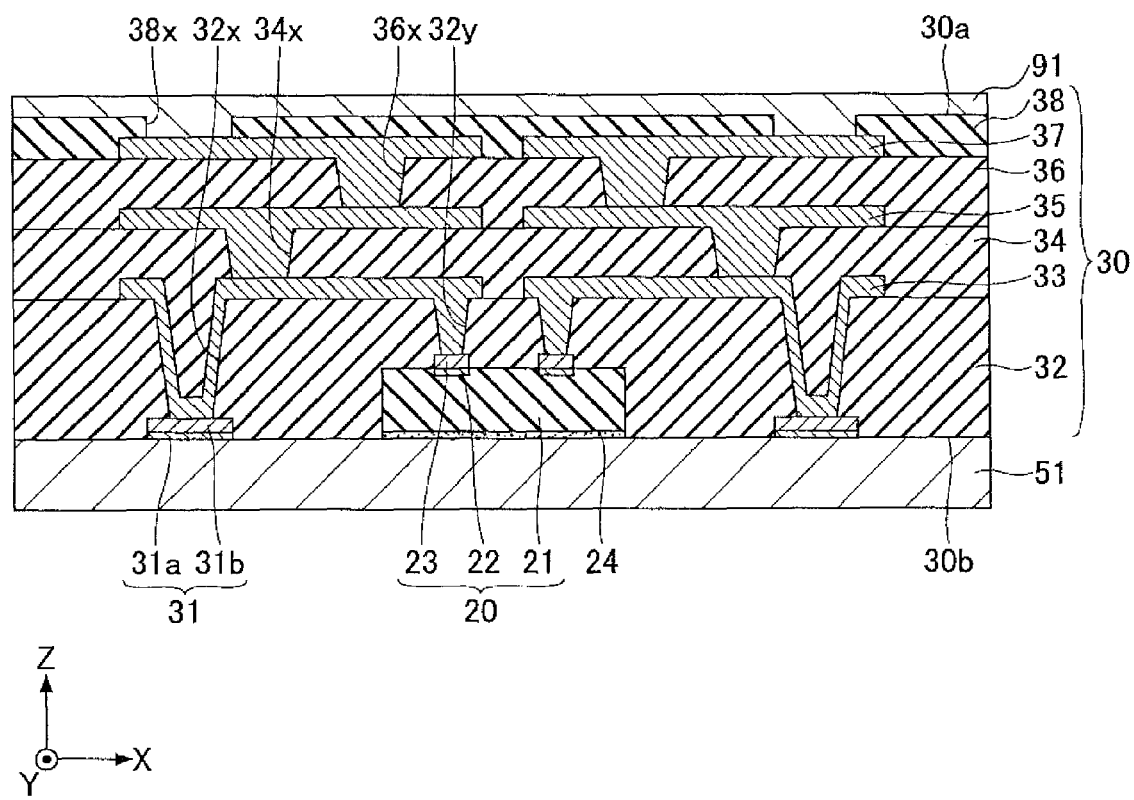

Then, in the process illustrated in FIG. 11, a metal layer 91 is formed on the solder resist layer 38 and the wiring layer 37 exposed in the opening part 38x. In forming the metal layer 91, a first metal layer is formed on the solder resist layer 38 and the wiring layer 37 exposed in the opening part 38x by using, for example, an electroless plating method or a sputtering method. Then, a second metal layer is formed on the first metal layer with an electroplating method using the first layer as a power-feeding layer. For example, a metal material having copper (Cu) as a main component may be used as the material of the metal layer 91. The thickness of the metal layer 91 may be, for example, approximately 10 μm.

Figure 12:
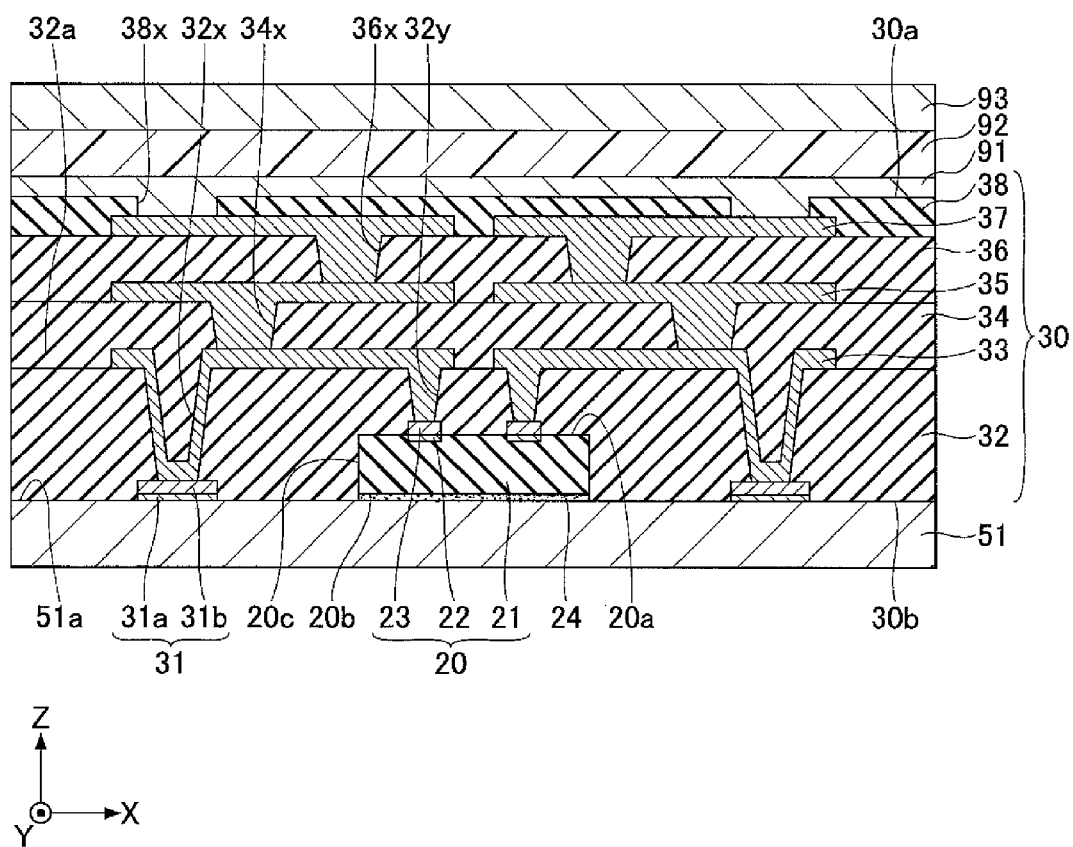

Then, in the process illustrated in FIG. 12, a resin film 92 is formed on the metal layer 91. Then, a metal foil 93 is formed on the resin film 92. The resin film 92 may be formed by, for example, laminating an epoxy type insulating resin sheet on the metal layer 91. The thickness of the resin film 92 may be, for example, approximately 50 μm to 100 μm. The metal foil 93 may be formed by, for example, laminating a copper foil on the resin film 92. The thickness of the metal foil 93 may be, for example, approximately 70 μm to 100 μm.

In a case where the metal layer 91 is not formed and the resin film 92 is directly formed on the solder resist layer 38 and the wiring layer 37 exposed in the opening part 38x, resin residue may remain on the wiring layer 37 exposed in the opening part 38x even after a process of removing the resin film 92. By forming the metal layer 91 on the solder resist layer 38 and the wiring layer 37 exposed in the opening part 38x and forming the resin film 92 on the metal layer 91, residual resin can be prevented from remaining on the wiring layer 37 exposed in the opening part 38x. The metal layer 91, the resin film 92, and the metal foil 93 is a representative example of the second supporting member according to an embodiment of the present invention.

Figure 13:
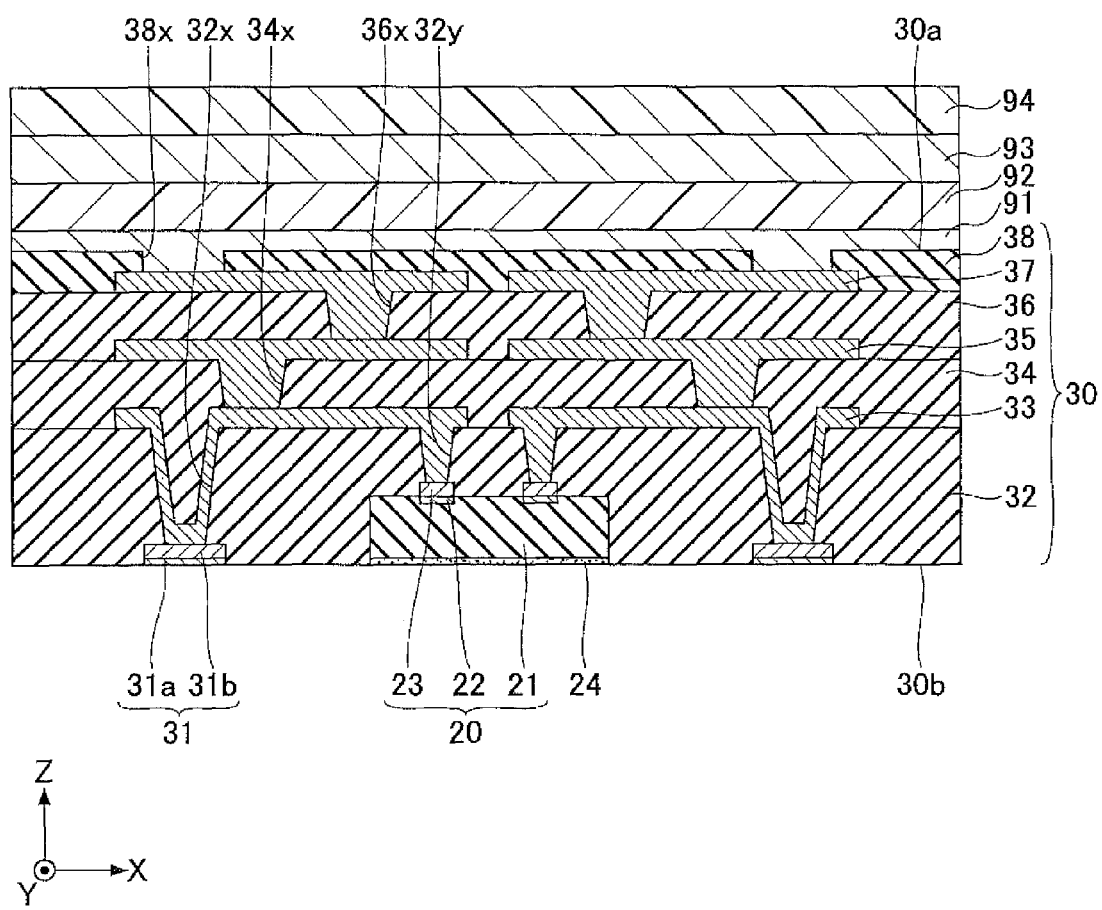

Then, in the process illustrated in FIG. 13, a resist layer 94 is formed on the metal foil 93. Then, the supporting member 51 is removed. The supporting member 51 (which is formed of copper foil in this embodiment) may be removed by performing wet-etching with an etching liquid such as a ferric chloride solution, a cupric chloride solution, an ammonium persulfate solution, an ammonium chlorocuprate solution, a hydrogen peroxide solution or a sulfate solution. In performing the wet-etching, the supporting member 51 can be selectively etched (i.e. wet-etching the supporting member 51 only) owing to the gold (Au) film being the outermost layer of the wiring layer 31 exposed from the insulating layer 32 and the adhesive layer 24 being adhered to the rear surface of the semiconductor chip 20 exposed from the insulating layer 32. It is to be noted that a resist layer 94 is provided on the metal foil 93 for preventing the metal foil 93 from being removed during the wet-etching process. In a case where the metal foil 93 is formed of a metal that cannot be removed by the etching liquid, the resist layer 94 need not be formed on the metal foil 93.

Supposing a case where the supporting member 51 is removed without forming the metal layer 91, the resin film 92, and the metal foil 93 on a side of the wiring substrate 30 toward the first main surface 30a (hereinafter also referred to as "first surface of wiring substrate 30") of the wiring substrate 30, significant warping occurs in the wiring substrate 30. This is because the side in which the semiconductor chip 20 is embedded is resistant to deformation from thermal stress or the like whereas the side in which the semiconductor chip 20 is not embedded tends to deform due to thermal stress or the like.

In this embodiment, a layered structure including the metal layer 91, the resin film 92, and the metal foil 93 functions as a supporting member having high rigidity because the metal layer 91, the resin film 92, and the metal foil 93 are formed on a side of the wiring substrate 30 toward the first main surface 30a of the wiring substrate 30. In other words, the semiconductor package 10 has a structure in which the semiconductor chip 20 having high rigidity is formed on one side of the semiconductor package 10 whereas the layered structure including the metal layer 91, the resin film 92, and the metal foil 93 (that functions as a supporting member) is formed on the other (opposite) side of the semiconductor package 10. That is, the semiconductor chip 20 having high rigidity and the layered structure including the metal layer 91, the resin film 92, and the metal foil 93 (that functions as a supporting member) are arranged substantially symmetrical to each other in the vertical direction (Z direction) of the semiconductor package 10 (i.e. arranged on the upper and lower sides of the semiconductor package 10). Thereby, the values of the physical properties (e.g., thermal expansion coefficient, Young's modulus) between the upper and lower sides of the semiconductor package 10 can be balanced. Therefore, even after the supporting member 51 is removed, significant warping of the wiring substrate 30 can be prevented.

It is to be noted that the rear surface of the semiconductor chip 20 may be exposed from the insulating layer 32 after removing the supporting member 51 and then removing the adhesive layer 24 adhered to the rear surface of the semiconductor chip 20 by using, for example, a plasma etching process.

Figure 14:
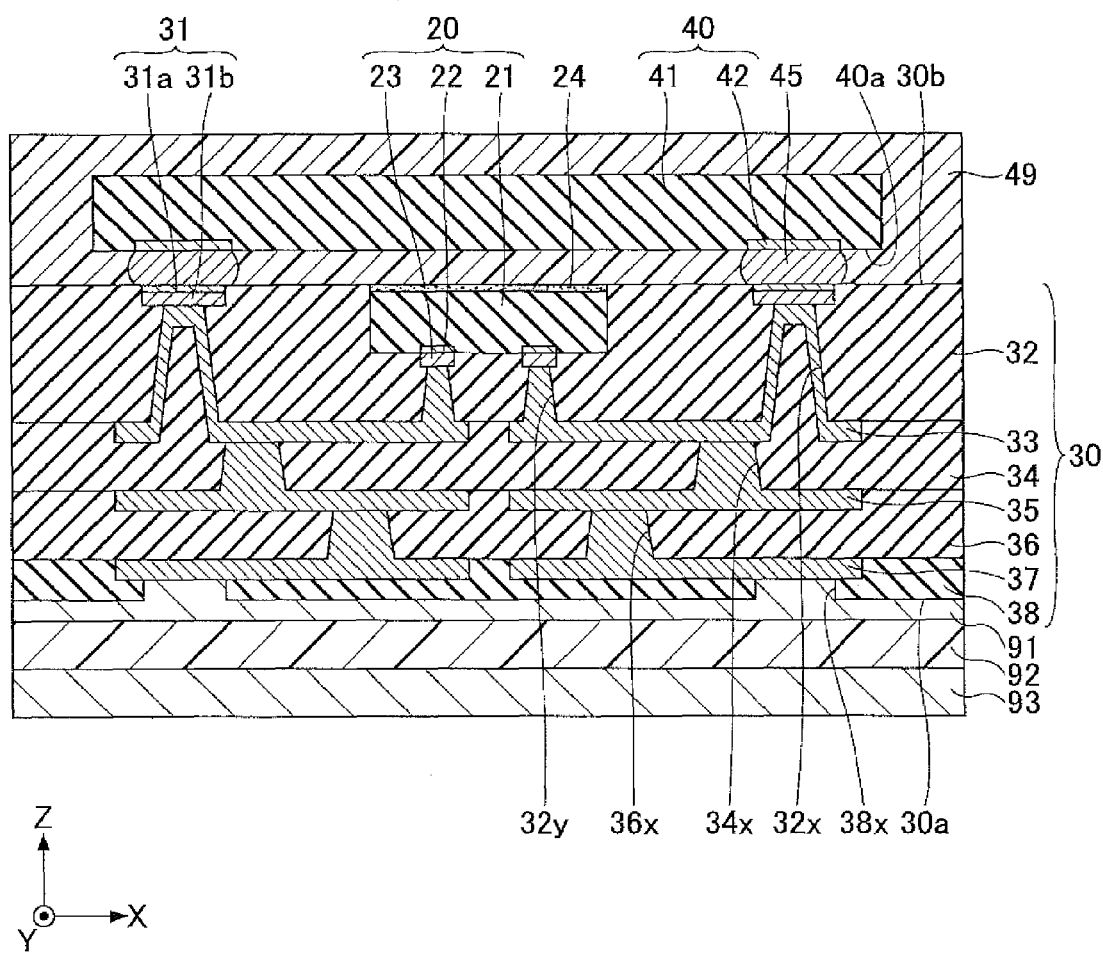

Then, in the process illustrated in FIG. 14, the semiconductor chip 40 is prepared after removing the resist layer 94 of FIG. 13. The configuration illustrated in FIG. 13 is flipped vertically (i.e. flipped upside down). Then, the semiconductor chip 40 is connected to a side of the wiring substrate 10 toward the second surface 30b by flip-chip bonding. Then, the semiconductor chip 40 is sealed by the sealing resin 49. The semiconductor chip 40 includes a semiconductor substrate 41 and an electrode pad 42. The electrode pad 42 is formed on a side of the semiconductor chip 40 toward a target circuit surface 40a of the semiconductor chip 40. The thickness of the semiconductor chip 40 may be reduced to a thickness of, for example, approximately 200 μm.

In order to connect the semiconductor chip 40 to a side of the wiring substrate 10 toward the second surface 30b by flip-chip bonding, the bonding part 45 is disposed on the first electrode pad 31 of the wiring substrate 30. The bonding part 45 may be, for example, a solder ball. For example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu) may be used as the material of the solder ball.

Then, the electrode pad 42 of the semiconductor chip 40 is positioned in contact with the bonding part 45. Then, the bonding part 45 is melted by heating the bonding part 45 to a temperature of, approximately 250° C. Then, the bonding part 45 is cured by cooling the bonding part 45. Thereby, the electrode pad 42 of the semiconductor chip 40 and the first electrode pad 31 of the wiring substrate 30 are electrically connected to each other by way of the bonding part 45. It is to be noted that the bonding part 45 may be provided on the electrode pad 42 of the semiconductor chip 40 and connected to the wiring substrate 30 by flip-chip bonding.

The sealing resin 49 may be formed by using, for example, a transfer molding method. For example, an insulating resin (mold resin) such as an epoxy type resin having a thermosetting property or a polyimide type resin may be used as the material of the sealing resin 49. The sealing resin 49 may include a filler such as silica ($SiO_2$). The thickness of the sealing resin 49 may be, for example, 300 μm to 400 μm.

It is to be noted that the rear surface of the semiconductor chip 40 may be exposed from the sealing resin 49 by polishing an upper surface of the sealing resin 49. Thereby, the heat releasing property of the semiconductor chip 40 can be improved.

Then, after performing the process illustrated in FIG. 14, the metal layer 91, the resin film 92, and the metal foil 93 illustrated in FIG. 14 are removed. In a case where the metal foil 93 is formed of copper (Cu), the metal foil 93 may be removed by performing wet-etching with an etching liquid such as a ferric chloride solution, a cupric chloride solution, an ammonium persulfate solution, an ammonium chlorocuprate solution, a hydrogen peroxide solution or a sulfate solution. The resin film 92 may be removed by using, for example, a mechanical grinding method. In a case where the metal layer 91 is formed of copper (Cu), the etching liquid used for etching the metal foil 93 may be used for removing the metal layer 91.

By forming the metal layer (e.g., gold (Au) layer) on the wiring layer 37 exposed in the opening part 38x, the metal layer 91 can be selectively removed by using the same etching liquid used for removing the metal foil 93 in a case where the metal layer 91 is formed of copper (Cu).

In this process, even after removing the metal layer 91, the resin film 92, and the metal foil 93 functioning as a supporting member having high rigidity, significant warping of the semiconductor package 10 can be prevented. The semiconductor package 10 has a structure in which the semiconductor chips 20, 40 are arranged in the vicinity of a center part of the semiconductor package 10 in a thickness direction of the semiconductor package 10, and corresponding resin layers (e.g., insulating layer 32, sealing resin 49) are arranged at an outer side of the semiconductor chips 20, 40. In other words, the semiconductor package 10 has a structure in which the values of the physical properties (e.g., thermal expansion coefficient, Young's modulus) between the upper and lower sides of the semiconductor package 10 can be balanced. Owing to the structure of the semiconductor package 10, the generation of warping due to, for example, thermal stress can be reduced. Particularly, by forming the wiring substrate 30 and the sealing resin 49 with substantially the same thickness, a well-balanced structure can be obtained for the semiconductor package 10 in which the values of the physical properties (e.g., thermal expansion coefficient, Young's modulus) between the upper and lower sides of the semiconductor package 10 are balanced. Thereby, generation of warping due to, for example, thermal stress can be significantly reduced.

As illustrated in FIG. 2-14, the above-described embodiment of the present invention is an example of manufacturing a single semiconductor package 10. However, components that are to be formed into multiple semiconductor packages 10 may be provided on the supporting member 51, the metal layer 91, the resin film 92, and the metal foil 93, so that multiple semiconductor packages 10 can be obtained by dicing the components into separate pieces after the removal of the supporting member 51, the metal layer 91, the resin film 92, and the metal foil 93. In cutting the components into separate pieces, one of the cut pieces may include multiple semiconductor chips 20, 40. In this case, the semiconductor package 10 includes multiple semiconductor chips 20, 40.

With the semiconductor package 10 according to the first embodiment of the present invention, there can be provided a structure in which the semiconductor chips 20, 40 are arranged in the vicinity of a center part of the semiconductor package 10 in a thickness direction of the semiconductor package 10, and corresponding resin layers (e.g., insulating layer 32, sealing resin 49) are arranged at an outer side of the semiconductor chips 20, 40. In other words, the semiconductor package 10 has a structure in which the values of the physical properties (e.g., thermal expansion coefficient, Young's modulus) between the upper and lower sides of the semiconductor package 10 can be balanced. Owing to the structure of the semiconductor package 10, the generation of warping due to, for example, thermal stress can be reduced. Particularly, by forming the wiring substrate 30 and the sealing resin 49 with substantially the same thickness, a well-balanced structure can be obtained for the semiconductor package 10 in which the values of the physical properties (e.g., thermal expansion coefficient, Young's modulus) between the upper and lower sides of the semiconductor package 10 are balanced. Thereby, generation of warping due to, for example, thermal stress can be significantly reduced.

With the method for manufacturing the semiconductor package 10 according to the first embodiment of the present invention, the metal layer 91, the resin film 92, and the metal foil 93 are formed on the side of the wiring substrate 30 toward the first main surface 30a (i.e. opposite to the side of the wiring substrate 30 in which the semiconductor chip 20 is embedded) before the removal of the supporting member 51. Therefore, the metal layer 91, the resin film 92, and the metal foil 93 function as a supporting member having high rigidity. In other words, the semiconductor package 10 has a structure in which the semiconductor chip 20 having high rigidity and the layered structure including the metal layer 91, the resin film 92, and the metal foil 93 (that functions as a supporting member having high rigidity) are arranged substantially symmetrical to each other in the vertical direction of the semiconductor package 10 (i.e. arranged on the upper and lower sides of the semiconductor package 10). Thereby, the values of the physical properties (e.g., thermal expansion coefficient, Young's modulus) between the upper and lower sides of the semiconductor package 10 can be balanced. As a result, the wiring substrate 30 can be prevented from significantly warping when removing the supporting member 51.

<First Modified Example of First Embodiment>

In the following first modified example of the first embodiment of the present invention, a semiconductor package is manufactured by a method different from the manufacturing method of the above-described first embodiment of the present invention. In the description and drawings of first modified example, like components are denoted by like reference numerals as those of the first embodiment and are not further described.

Figure 15:
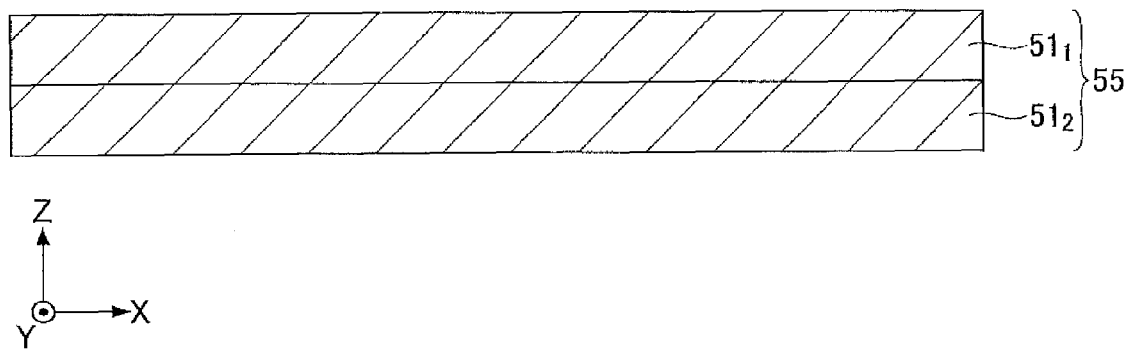
FIGS. 15 and 16 are schematic diagrams illustrating processes for manufacturing a semiconductor package according to a first modified example of the first embodiment of the present invention.
Figure 16:
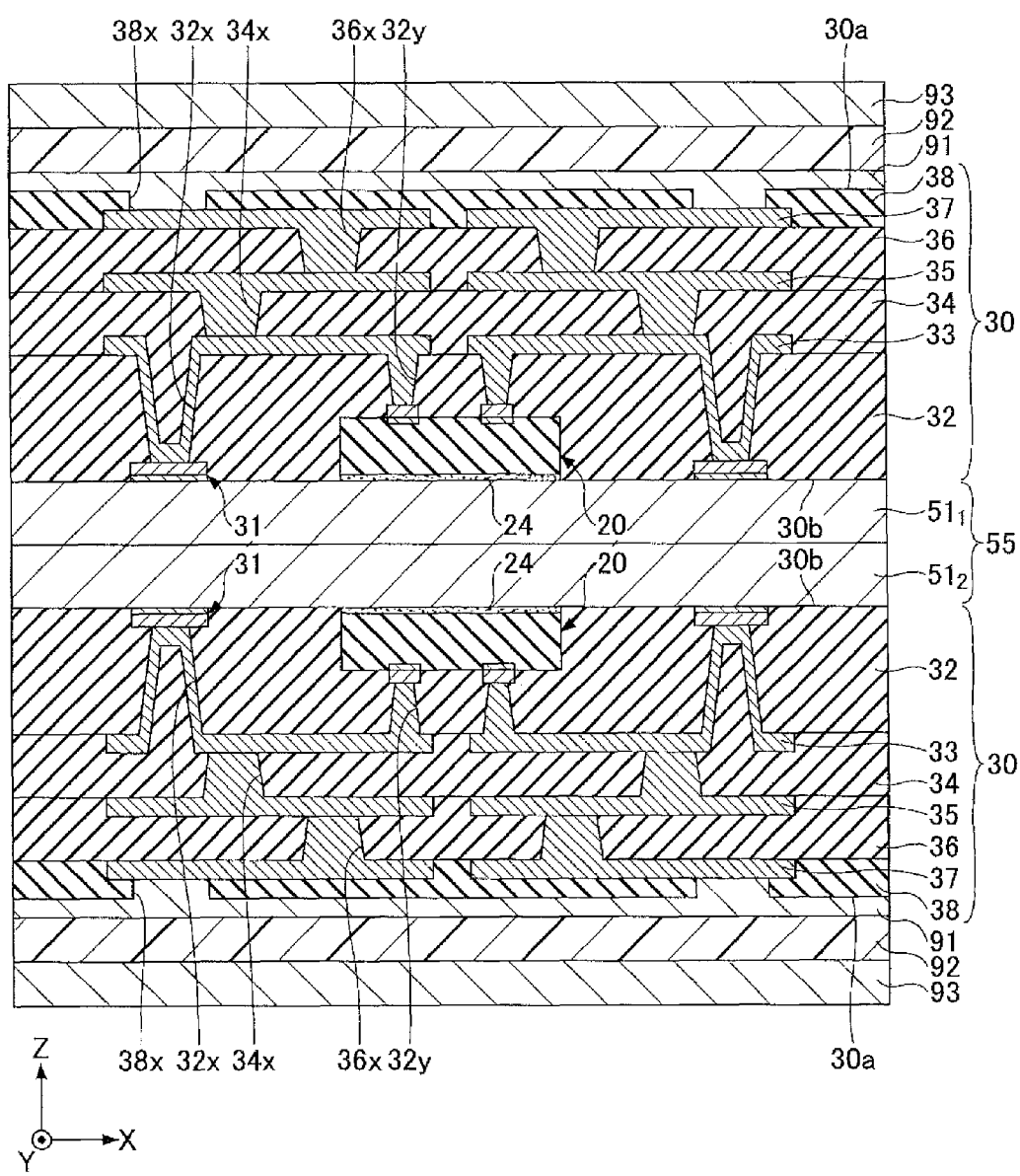

FIGS. 15 and 16 are schematic diagrams illustrating the processes for manufacturing the semiconductor package 10 according to the first modified example of the first embodiment of the present invention.

In the process illustrated in FIG. 15, a supporting member 55 having first and second supporting member parts $51_1$, $51_2$ adhered one on top of the other is prepared. The first and second supporting member parts $51_1$, $51_2$ may be adhered to each other with an adhesive agent or the like. Although a silicon board, a glass board, a metal board, or a metal foil may be used to form the first and second supporting member parts $51_1$, $51_2$, copper foil is used in this embodiment. The thickness of the first and second supporting member parts $51_1$, $51_2$ may be, for example, approximately 35 μm to 100 μm.

Then, in the process illustrated in FIG. 16, the wiring substrate 30, the metal layer 91, the resin film 92, and the metal foil 93 are formed on an upper surface of the first supporting member part $51_1$ by performing the processes illustrated in FIGS. 2-12 of the first embodiment. Likewise, the wiring substrate 30, the metal layer 91, the resin film 92, and the metal foil 93 are formed on a lower surface of the second supporting member part $51_2$ by performing the processes illustrated in FIGS. 2-12 of the first embodiment.

Then, after the process illustrated in FIG. 14, the supporting member 55 is separated into the first and second supporting member parts $51_1$, $51_2$ by removing the adhesive agent or the like. Thereby, two structures (each of which corresponding to the structure illustrated in FIG. 12) can be manufactured. Then, two semiconductor packages 10 can be obtained by performing the processes illustrated in FIGS. 13 and 14 and removing the metal layer 91, the resin film 92, and the metal foil 93 from the two structures.

By preparing the supporting member 55 having the first and the second supporting members $51_1$, $51_2$ adhered one on top of the other, the layered structure including the wiring substrate 30 can be simultaneously formed on the upper surface of the first supporting member part $51_1$ and the lower surface of the second supporting member part $51_2$. Then, by separating the supporting member 51 into the first and the second supporting member parts $51_1$, $51_2$ and performing the subsequent remaining processes after removing the first and the second supporting member parts $51_1$, $51_2$ along with performing the above-described series of processes illustrated in FIGS. 2-12, two semiconductor packages 10 can be manufactured.

<Second Modified Example of First Embodiment>

In the following second modified example of the first embodiment of the present invention, a semiconductor chip is formed on a wiring substrate by using an anisotropic conductive film. In the description and drawings of second modified example, like components are denoted by like reference numerals as those of the first embodiment and are not further described.

Figure 17:
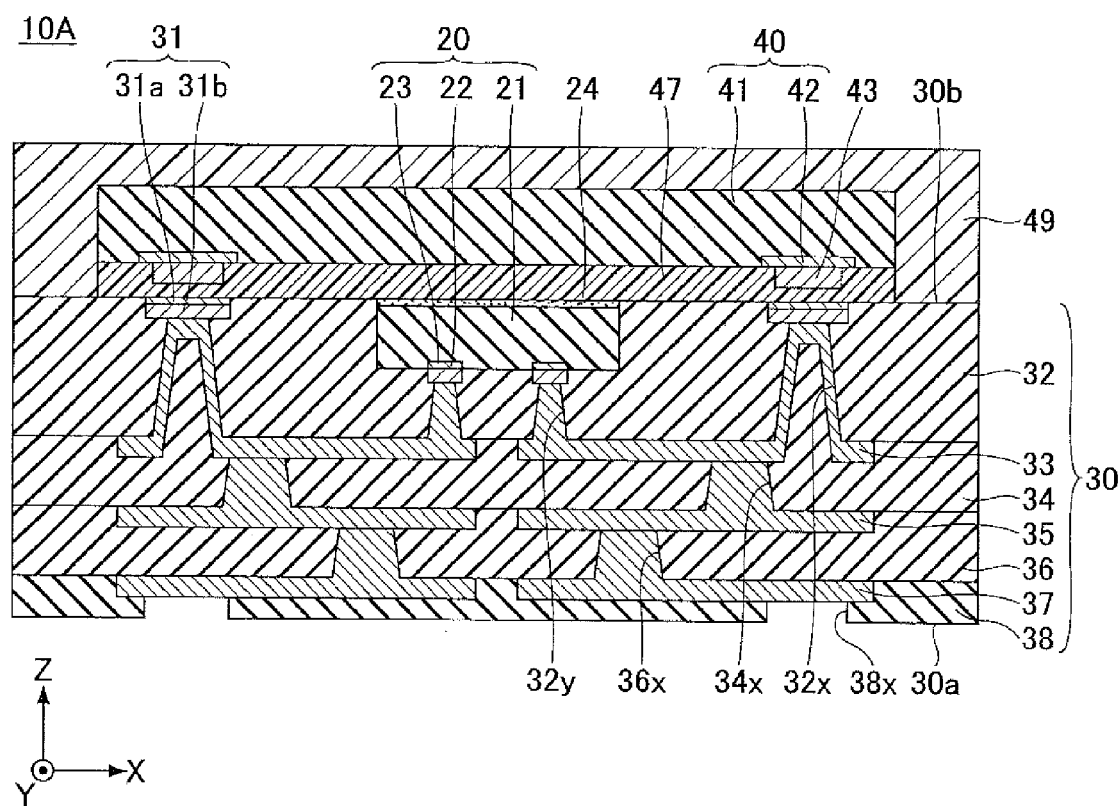
FIG. 17 is a cross-sectional view illustrating a semiconductor package according to a second modified example of the first embodiment of the present invention.

FIG. 17 is a cross-sectional view illustrating a semiconductor package 10A according to the second modified example of the first embodiment of the present invention. With reference to FIG. 17, the semiconductor package 10A is different from the semiconductor package 10 (see, for example, FIG. 1) in that the semiconductor chip is connected to the wiring substrate 30 by using an anisotropic conductive film instead of having the semiconductor chip 40 connected to the wiring substrate 30 by flip-chip bonding.

The semiconductor chip 40 of the second modified example is mounted on the wiring substrate 30 in a state facing downward (i.e. a state having the target circuit surface facing downward). More specifically, a bump 43 is formed on the electrode pad 42 of the semiconductor chip 40. For example, a copper post having a pillar shape may be used as the bump 43. The bump 43 is electrically connected to the first pad 31 of the wiring substrate 30 by way of an anisotropic conductive film 47.

For example, a semi-cured resin film (e.g., epoxy type thermosetting resin) having conductive particles of nickel (Ni), gold (Au), or silver (Ag) dispersed therein may be used as the anisotropic conductive film 47.

The semiconductor chip 40 is sealed by the sealing resin 49. In order to improve the heat releasing property of the semiconductor chip 40, the rear surface of the semiconductor chip 40 may be exposed from the sealing resin 49.

Next, a method for electrically connecting the bump 43 of the semiconductor chip 40 and the first electrode pad 31 of the wiring substrate 30 by using the anisotropic conductive film 47 is described. First, the anisotropic conductive film 47 being in a semi-cured state is adhered (temporarily stuck) to the second main surface 30b of the wiring substrate 30.

Then, the semiconductor chip 40 is prepared. Then, the position of the bump 43 of the semiconductor chip 40 is matched with the position of the first electrode pad 31 of the wiring substrate 30, so that the bump 43 of the semiconductor chip 40 faces the corresponding first electrode pad 31 of the wiring substrate 30 interposed by the anisotropic conductive film 47. The matching of the position of the bump 43 of the semiconductor chip 40 and the position of the second electrode pad 37 of the wiring substrate 30 may be performed by using, for example, a bonding tool.

Then, a pressing force is applied from the semiconductor chip 40 to the anisotropic conductive film 47 by using, for example, a bonding tool. For example, in the case where the bonding tool is used, the anisotropic conductive film 47 is cured by applying a pressing force to the anisotropic conductive film 47 being in a semi-cured state while heating the semiconductor chip 40.

In curing the anisotropic conductive film 47, the anisotropic conductive film 47 is compressed by holding (sandwiching) the anisotropic conductive film 47 between the bump 43 of the semiconductor chip 40 and the first electrode pad 31 of the wiring substrate 30. This causes the conductive particles dispersed in the anisotropic conductive film 47 to contact each other and electrically connect the bump 43 of the semiconductor chip 40 and the first electrode pad 31 of the wiring substrate 30.

Although the rear surface of the semiconductor chip 20 is insulated by the adhesive layer 24, an insulating film or the like may be formed on the rear surface of the semiconductor chip 20, the target circuit surface 40a of the semiconductor chip 40, or both, in order to thoroughly eliminate the risk of short-circuiting between the rear surface of the semiconductor chip 20 and the target circuit surface 40a of the semiconductor chip 40 by way of the conductive particles in the anisotropic conductive film 47. Alternatively, an insulating sheet or the like may be provided between the rear surface of the semiconductor chip 20 and the target circuit surface of the semiconductor chip 40.

Accordingly, the semiconductor package 10A of the second modified example can attain substantially the same effects as those of the semiconductor package 10 of the first embodiment even in a case where the semiconductor chip 40 is connected to the wiring substrate 30 by the anisotropic conductive film 47.

<Third Modified Example of First Embodiment>

In the following third modified example of the first embodiment of the present invention, a semiconductor chip is formed on a wiring substrate by using a bonding wire. In the description and drawings of third modified example, like components are denoted by like reference numerals as those of the first embodiment and are not further described.

Figure 18:
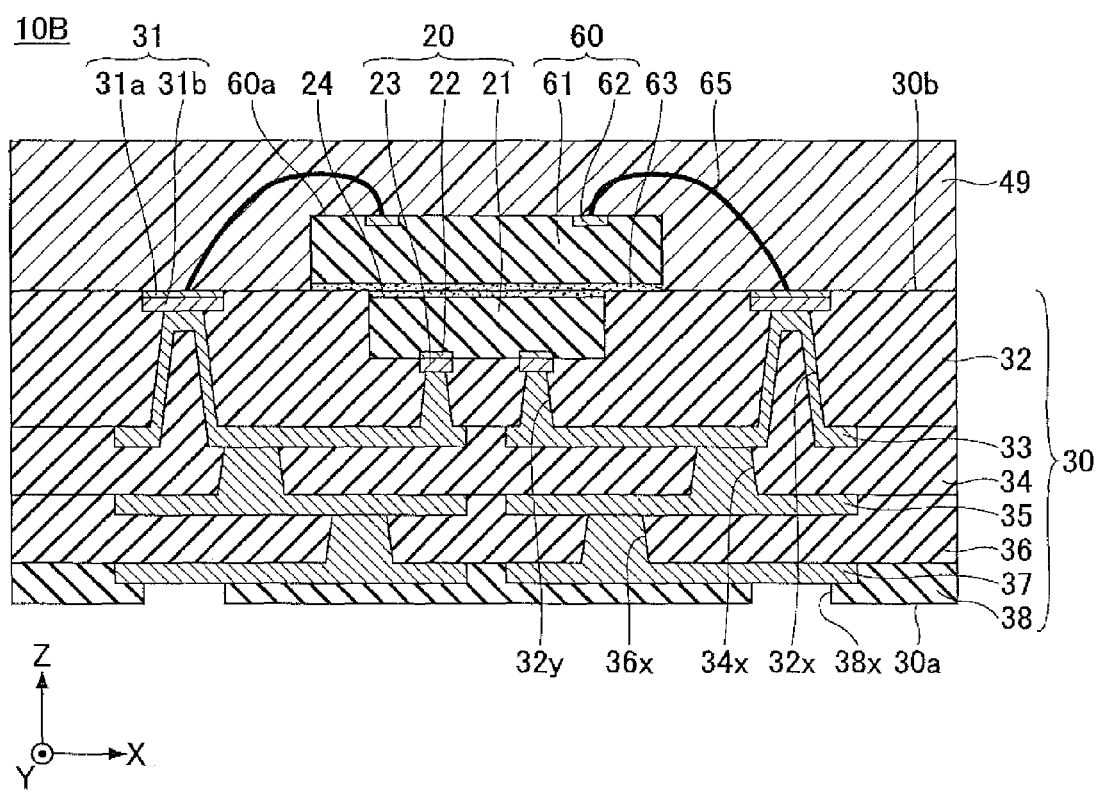
FIG. 18 is a cross-sectional view illustrating a semiconductor package according to a third modified example of the first embodiment of the present invention.

FIG. 18 is a cross-sectional view illustrating a semiconductor package 10B according to the third modified example of the first embodiment of the present invention. With reference to FIG. 18, the semiconductor package 10B is different from the semiconductor package 10 (see, for example, FIG. 1) in that a semiconductor chip 60 is connected to the wiring substrate 30 by way of a bonding wire 65 instead of having the semiconductor chip 40 connected to the wiring substrate 30 by flip-chip bonding.

The semiconductor chip 60 includes a semiconductor substrate 61 and an electrode pad 62. Because the semiconductor substrate 61 and the electrode pad 62 have substantially the same configuration as that of the semiconductor substrate 41 and the electrode pad 42 of the semiconductor chip 40, description of the semiconductor substrate 61 and the electrode pad 62 is omitted. Unlike the semiconductor chip 40, the semiconductor chip 60 is mounted on the wiring substrate 30 in a state facing upward (i.e. a state having the target circuit surface facing upward).

More specifically, the semiconductor chip 60 is fixed to the second main surface 30b of the wiring substrate 30 interposed by an adhesive layer (e.g., die-attach film) 63. Then, the electrode pad 62 of the semiconductor chip 60 is electrically connected to the first electrode pad 31 of the wiring substrate 30 by way of the bonding wire 65. The bonding wire 65 is a thin conductive wire formed of, for example, gold (Au) or copper (Cu). The semiconductor chip 60 is sealed by the sealing resin 49.

Although the rear surface of the semiconductor chip 20 and the rear surface of the semiconductor chip 60 are insulated by the adhesive layers 24, 63, an insulating film or the like may be formed on the rear surface of the semiconductor chip 20, the target circuit surface 60a of the semiconductor chip 40, or both, in order to thoroughly eliminate the risk of short-circuiting between the rear surface of the semiconductor chip 20 and the semiconductor chip 60. Alternatively, an insulating sheet or the like may be provided between the rear surface of the semiconductor chip 20 and the rear surface of the semiconductor chip 60.

Accordingly, the semiconductor package 10B of the third modified example can attain substantially the same effects as those of the semiconductor package 10 of the first embodiment even in a case where the semiconductor chip 60 is connected to the wiring substrate 30 by way of the bonding wire 65.

Unlike a case of connecting a semiconductor chip to a wiring substrate by using a flip-chip bonding method, a semiconductor chip need not be heated in a case of connecting the semiconductor chip on a wiring substrate by way of a bonding wire. Therefore, according to the third modified example, the method of connecting the semiconductor chip on the wiring substrate by way of the bonding wire is effective for preventing the wiring substrate from warping and reducing bending of the wiring substrate.

<Fourth Modified Example of First Embodiment>

In the following fourth modified example of the first embodiment of the present invention, a semiconductor chip is formed on a wiring substrate by using a flip-chip bonding method and another semiconductor chip is formed on the semiconductor chip by using the flip-chip bonding method. In the description and drawings of fourth modified example, like components are denoted by like reference numerals as those of the first embodiment and are not further described.

Figure 19:
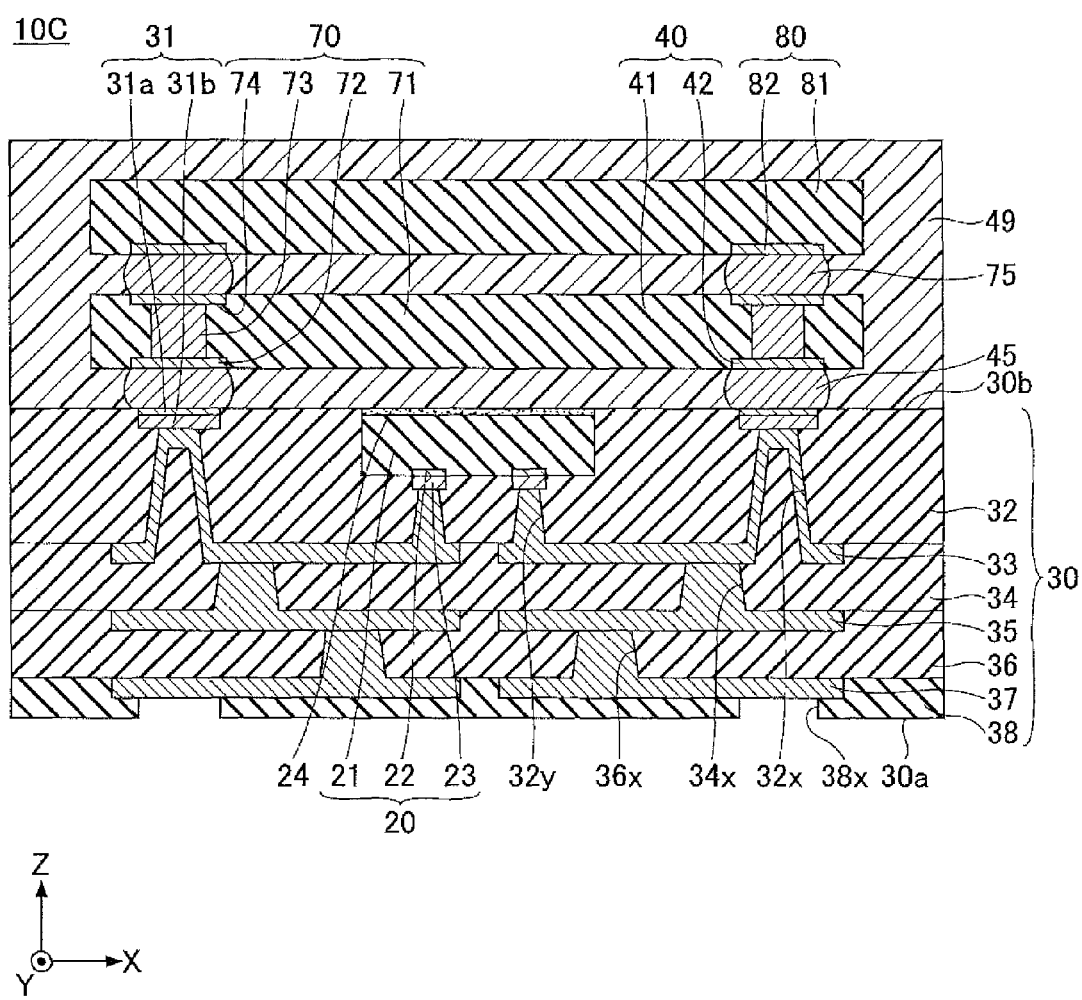
FIG. 19 is a cross-sectional view illustrating a semiconductor package according to a fourth modified example of the first embodiment of the present invention.

FIG. 19 is a cross-sectional view illustrating a semiconductor package 10C according to the fourth modified example of the first embodiment of the present invention. With reference to FIG. 19, the semiconductor package 10C is different from the semiconductor package 10 (see, for example, FIG. 1) in that semiconductor chips 70, 80 are connected to the wiring substrate 30 by flip-chip bonding instead of having the semiconductor chip 40 connected to the wiring substrate 30 by flip-chip bonding.

The semiconductor chip 70 includes a semiconductor substrate 71, electrode pads 72, 74, and a through-electrode 73. The electrode pad 72 is provided on the first side of the semiconductor substrate 71. The electrode pad 74 is provided on the second side of the semiconductor substrate 71 (a side opposite to the first side of the semiconductor substrate. The electrode pad 72 and the electrode pad 74 are electrically connected to each other by way of the through-electrode 73.

Because the semiconductor substrate 71 and the electrode pads 72, 74 have substantially the same configuration as that of the semiconductor substrate 41 and the electrode pad 42 of the semiconductor chip 40, description of the semiconductor substrate 71 and the electrode pads 72, 74 is omitted. For example, a metal material having copper (Cu) as a main component may be used as the material of the through-electrode 73.

The semiconductor chip 80 includes a semiconductor substrate 81 and an electrode pad 82. Because the semiconductor substrate 81 and the electrode pad 82 have substantially the same configuration as that of the semiconductor substrate 41 and the electrode pad 42 of the semiconductor chip 40, description of the semiconductor substrate 81 and the electrode pad 82 is omitted.

The semiconductor chip 70 of the fourth modified example is mounted on the wiring substrate 30 in a state facing downward (i.e. a state having the target circuit surface facing downward). More specifically, the electrode pad 72 of the semiconductor chip 70 is electrically connected to the first electrode pad 31 of the wiring substrate 30 by way of the bonding part (e.g., solder ball) 65. The electrode pad 72 is electrically connected to a semiconductor integrated circuit (not illustrated) of the semiconductor chip 70.

The electrode pad 82 of the semiconductor chip 80 is electrically connected to the electrode pad 74 of the semiconductor chip 70 by way of a bonding part 75. Similar to the bonding part 65, a solder ball may be used as the bonding part 75. The semiconductor chips 70, 80 are sealed by the sealing resin 49. In order to improve the heat releasing property of the semiconductor chip 80, the rear surface of the semiconductor chip 80 may be exposed from the sealing resin 49.

Accordingly, the semiconductor package 10C of the fourth modified example can attain substantially the same effects as those of the semiconductor package 10 of the first embodiment even in a case where multiple layers of semiconductor chips are connected to the wiring substrate by flip-chip bonding.

<Fifth Modified Example of First Embodiment>

In the following fifth modified example of the first embodiment of the present invention, a planar member having no semiconductor integrated circuit formed thereon is mounted on a wiring substrate. In the description and drawings of fifth modified example, like components are denoted by like reference numerals as those of the first embodiment and are not further described.

Figure 20:
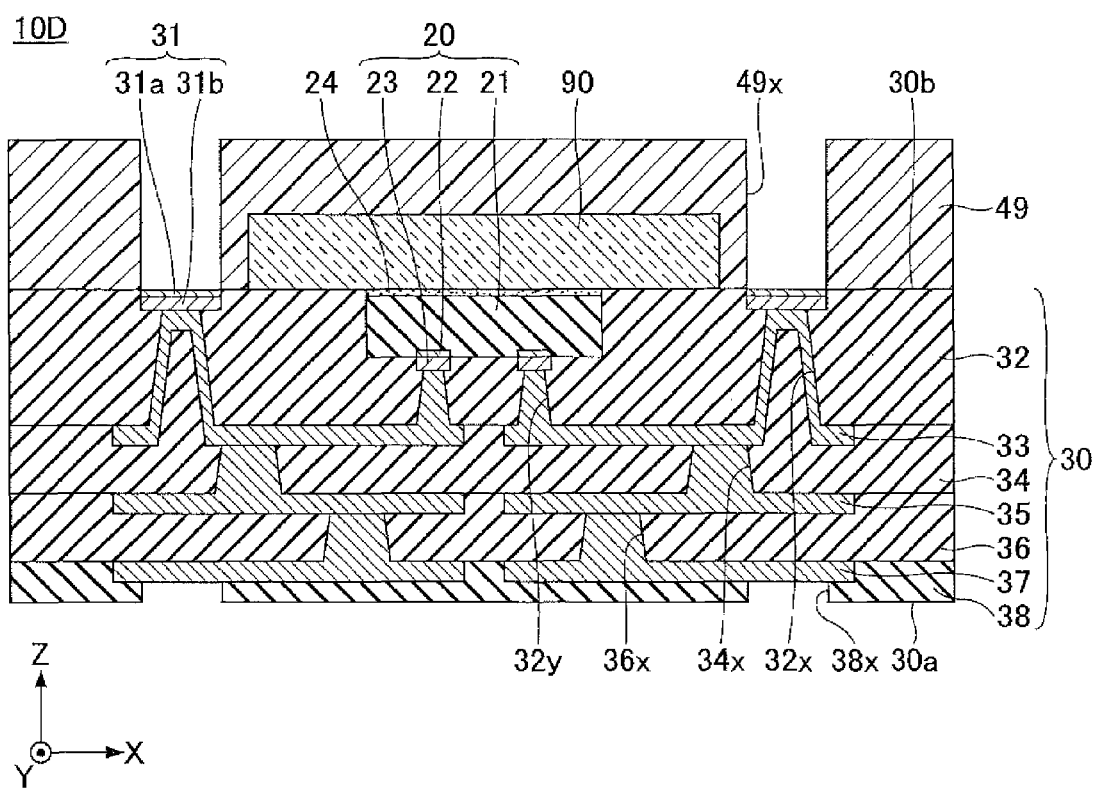
FIG. 20 is a cross-sectional view illustrating a semiconductor package according to a fifth modified example of the first embodiment of the present invention.

FIG. 20 is a cross-sectional view illustrating a semiconductor package 10D according to the fifth modified example of the first embodiment of the present invention. With reference to FIG. 20, the semiconductor package 10D is different from the semiconductor package 10 (see, for example, FIG. 1) in that a planar member 90 is formed on the wiring substrate 30 instead of having the semiconductor chip 40 connected to the wiring substrate 30 by flip-chip bonding.

The planar member 90 is mounted on the second main surface 30b of the wiring substrate 30 and is sealed by the sealing resin 49. A through-hole 49x exposing the first electrode pad 31 is formed in the sealing resin 49. By forming the through-hole 49x, other semiconductor chips and electronic components (e.g., condenser) may be mounted on the sealing resin 49 and electrically connect with the first electrode pad 31 by way of the through-hole 49x.

The through-hole 49x has, for example, a circular shape from plan view. The diameter of the circular-shaped through-hole 49x may be, for example, approximately 100 μm to 350 μm. The through-hole 49x may be formed by, for example, a transfer molding method using a die having a protruding part corresponding to the through-hole, a laser processing method, or a blasting method.

It is preferable to form the planar member 90 by using an inorganic material having a planar shape. For example, a planar silicon, glass, or ceramic having no semiconductor integrated circuit formed thereon may be used as the planer member 90. In a case where a type of glass such as borosilicate glass is used as the planar member 90, the thermal expansion coefficient of the planar member 90 is approximately 3 ppm/° C. In a case where a type of ceramic such as mullite is used as the planar member 90, the thermal expansion coefficient of the planar member 90 is approximately 4.5 ppm/° C. In a case where alumina is used as the planar member 90, the thermal expansion coefficient of the planar member 90 is approximately 6-7 ppm/° C.

The thickness of the planar member may be, for example, approximately 200 μm. Although the planar member 90 is mounted on a part of the second main surface 30b of the wiring substrate 30, the planar member 90 may be mounted on the entire surface of the second main surface 30b of the wiring substrate 30. In this case, a through-hole that exposes the first electrode pad 31 may be formed in the planar member 90 and the sealing resin 49.

In a case where an insulator such as glass or ceramic is used as the planar member 90, short-circuiting would not occur between the planar member 90 and the rear surface of the semiconductor chip 20. In a case where a planar silicon material having no semiconductor integrated circuit formed thereon or a conductor such as a metal plate is used as the planar member 90, the planar member 90 is to be mounted after performing an insulating process on an interface between the rear surface of the semiconductor chip 20 and the planar member 90 for preventing short-circuiting therebetween.

Accordingly, the semiconductor package 10D of the fifth modified example can attain substantially the same effects as those of the semiconductor package 10 of the first embodiment even in a case where a planar member 90 having substantially the same thermal expansion coefficient as the semiconductor chip 20 is formed on the wiring substrate 30.

In a case where other semiconductor chips or electronic components (e.g., condenser) are not further mounted on the sealing resin 49, the wiring layer (first electrode pad) 31 need not be provided.

<Sixth Modified Example of First Embodiment>

In the following sixth modified example of the first embodiment of the present invention, a semiconductor chip is formed on a wiring substrate by using a flip-chip bonding method and sealed with a sealing resin, and a through-hole is formed in the sealing resin. In the description and drawings of sixth modified example, like components are denoted by like reference numerals as those of the first embodiment and are not further described.

Figure 21:
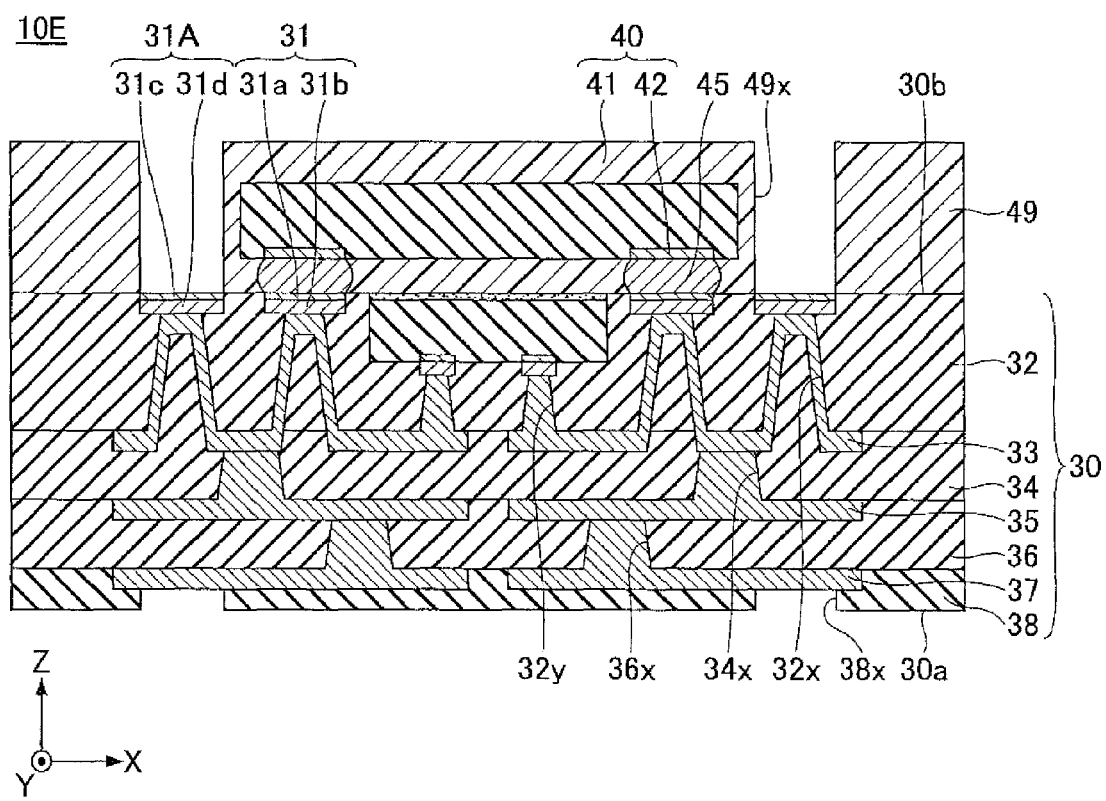
FIG. 21 is a cross-sectional view illustrating a semiconductor package according to a sixth modified example of the first embodiment of the present invention.

FIG. 21 is a cross-sectional view illustrating a semiconductor package 10E according to the sixth modified example of the first embodiment of the present invention. With reference to FIG. 21, the semiconductor package 10E is different from the semiconductor package 10 (see, for example, FIG. 1) in that the through-hole 49x is formed in the sealing resin 49.

The through-hole 49x is formed in the sealing resin 49. A third electrode pad 31A, which is a part of the wiring layer 31, is exposed in the through-hole 49x. The wiring layer 31 exposed in the through-hole 49x functions as an electrode pad that is electrically connected to a semiconductor chip or an electronic component (e.g., condenser) mounted on the sealing resin 49.

The third electrode pad 31A includes first and second layers 31c, 31d. A surface of the first layer 31c toward the second main surface 30b (hereinafter also referred to as "second surface of first layer 31c") is exposed on the insulating layer 32. The surface of the insulating layer 32 toward the second main surface 30b is substantially flush with the rear surface of the semiconductor chip 20. Because the first and the second layers 31c, 31d have substantially the same configuration as that of the first and the second layers 31a, 31b, description of the first and the second layers 31c, 31d is omitted.

Alternatively, the sealing resin 49 may be replaced with an underfill resin. In this case, the underfill resin is provided, so that the third electrode pad 31A is exposed.

In addition to the effects attained by the first embodiment of the present invention, the following effects can be attained by connecting the semiconductor chip onto the wiring substrate by flip-chip bonding, sealing the semiconductor chip with a sealing resin, and forming a through-hole in the sealing resin. That is, a semiconductor chip or an electronic component (e.g., condenser), which is to be electrically connected to the third electrode pad 31A, can be further mounted on the sealing resin 49 by way of the through-hole 49x.

<Seventh Modified Example of First Embodiment>

In the following seventh modified example of the first embodiment of the present invention, a semiconductor chip is formed on a wiring substrate by using a flip-chip bonding method and sealed with an underfill resin. In the description and drawings of seventh modified example, like components are denoted by like reference numerals as those of the first embodiment and are not further described.

Figure 22:
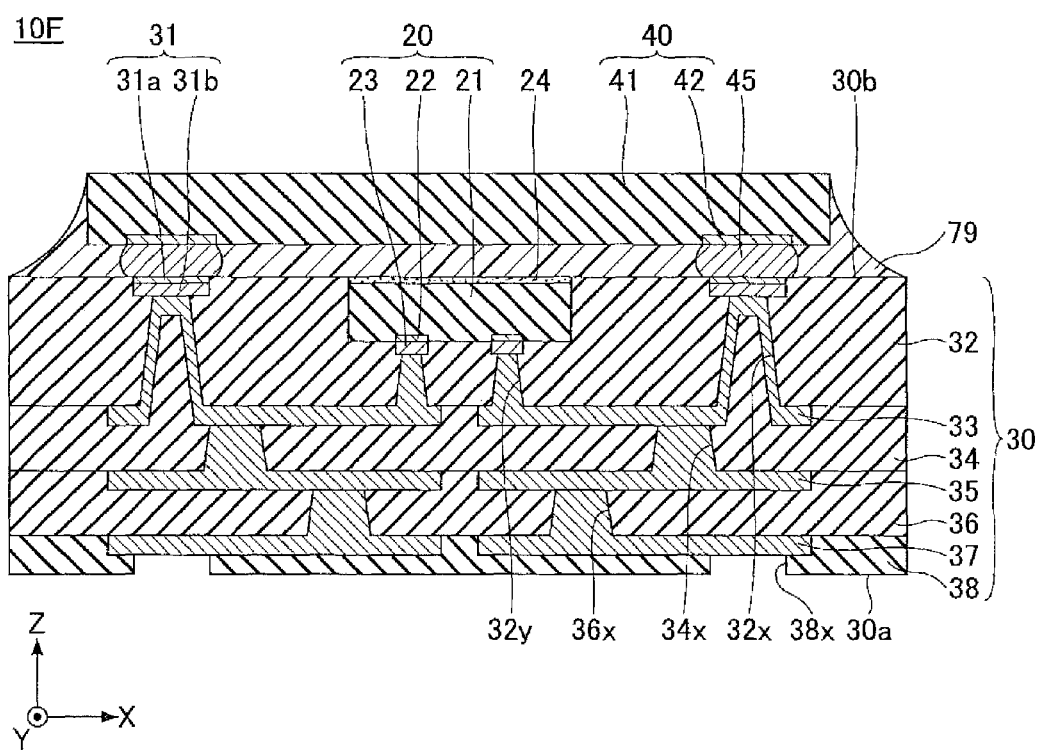
FIG. 22 is a cross-sectional view illustrating a semiconductor package according to a seventh modified example of the first embodiment of the present invention.

FIG. 22 is a cross-sectional view illustrating a semiconductor package 10F according to the seventh modified example of the first embodiment of the present invention. With reference to FIG. 22, the semiconductor package 10F is different from the semiconductor package 10 (see, for example, FIG. 1) in that an underfill resin 79 is used instead of the sealing resin 49.

The underfill resin 79 is filled in a space between the semiconductor chip 40 and the wiring substrate 30. The underfill resin 79 is also formed covering a part of a side surface of the semiconductor chip 40. For example, an insulating resin such as an epoxy type resin may be used as the underfill resin 79. The underfill resin 79 is another representative example of the second sealing insulating layer according to an embodiment of the present invention.

After connecting the semiconductor chip 40 to the wiring substrate 30 by flip-chip bonding, the underfill resin 79 is formed by filling the space between the semiconductor chip 40 and the wiring substrate 30 with an insulating resin (e.g., epoxy type resin) and curing the insulating resin. Alternatively, the underfill resin 79 may be formed by placing an insulating resin film being in a semi-cured state on the wiring substrate 30, connecting the semiconductor chip 40 to the wiring substrate 30 (interposed by the insulating resin film) by flip-chip bonding, and curing the insulating resin film.

Accordingly, the semiconductor package 10F of the seventh modified example can attain substantially the same effects as those of the semiconductor package 10 of the first embodiment even in a case where the sealing resin 49 is replaced with the underfill resin 79.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, although the semiconductor chip 20 is embedded in the outermost insulating layer 32 of the wiring substrate 30 according to the above-described embodiments and modified examples, the semiconductor chip 20 may be embedded in other insulating layers. However, in the case of embedding the semiconductor chip 20 in another insulating layer, the other insulating layer is to be determined in view of the balance between the values of the physical properties (e.g., thermal expansion coefficient, Young's modulus) of the upper and lower sides of the semiconductor package 10.

What is claimed is:

1. A semiconductor package comprising:
a first semiconductor chip including a target circuit surface and a side surface;
a first sealing insulating layer including a first surface positioned toward the target circuit surface and a second surface positioned opposite to the first surface, the first sealing insulating layer sealing the target circuit surface and the side surface;
a wiring layer formed on the first surface of the first sealing insulating layer;
an insulating layer formed on the wiring layer;
a second semiconductor chip mounted on the second surface of the first sealing insulating layer, the second semiconductor chip including a second target circuit surface on which a pad is provided, the second target circuit surface facing the first sealing insulating layer;
a second sealing insulating layer formed on the second surface and sealing the second semiconductor chip;
a penetration wiring penetrating the first sealing insulating layer; and
an electrode pad exposed from the second surface and electrically connected to the pad of the second semiconductor chip without a wiring interposed between the electrode pad and the pad of the second semiconductor chip;
wherein the penetration wiring electrically connects the wiring layer and the electrode pad,
wherein the second surface is flush with an exposed surface of the electrode pad,
wherein the first sealing insulating layer and the second sealing insulating layer are formed of resin,
wherein the first semiconductor chip and the wiring layer are electrically connected by way of the penetration wiring,
wherein the second semiconductor chip and the wiring layer are electrically connected by way of the penetration wiring,
wherein the second surface is flush with a rear surface of the first semiconductor chip,
wherein the first sealing insulating layer is a single layer,
wherein in a case where an adhesive layer is formed on the rear surface of the first semiconductor chip, the adhesive layer is flush with the second surface of the first sealing insulating layer.

2. A semiconductor package comprising:
a first semiconductor chip including a target circuit surface and a side surface;
a first sealing insulating layer including a first surface positioned toward the target circuit surface and a second surface positioned opposite to the first surface, the first sealing insulating layer sealing the target circuit surface and the side surface;
a wiring layer formed on the first surface of the first sealing insulating layer;
an insulating layer formed on the wiring layer;
an inorganic member having a planar shape with no semiconductor integrated circuit formed thereon and mounted on the second surface of the first sealing insulating layer, the inorganic member including a target surface facing the second surface of the first sealing insulating layer and directly contacting the second surface of the first sealing insulating layer;
a second sealing insulating layer formed on the second surface and sealing the inorganic member; and
a penetration wiring penetrating the first sealing insulating layer;
wherein the first semiconductor chip and the wiring layer are electrically connected by way of the penetration wiring,
wherein the second surface is flush with a rear surface of the first semiconductor chip,
wherein the first sealing insulating layer is a single layer,
wherein in a case where an adhesive layer is formed on the rear surface of the first semiconductor chip, the adhesive layer is flush with the second surface of the first sealing insulating layer,
wherein the first sealing insulating layer and the second sealing insulating layer are formed of resin.

3. The semiconductor package as claimed in claim 2, further comprising:

an electrode pad exposed from the second surface;
wherein the penetration wiring electrically connects the wiring layer and the electrode pad,
wherein the second surface is flush with an exposed surface of the electrode pad.

4. The semiconductor package as claimed in claim 1, wherein the second sealing insulating layer seals the second semiconductor chip by covering the second target circuit surface and the second side surface of the semiconductor chip.

5. The semiconductor package as claimed in claim 1, further comprising:
a second electrode pad exposed from the second surface, wherein the second sealing insulating layer includes a through-hole that exposes the second electrode pad.

6. The semiconductor package as claimed in claim 1, further comprising:
a second penetration wiring penetrating the first sealing insulating layer and electrically connecting the wiring layer formed on the first surface and the first semiconductor chip; and
first and second via holes penetrating the first sealing insulating layer;
wherein the first penetration wiring is integrally formed with the wiring layer on a sidewall of the first via hole and a surface of the electrode pad exposed in the first via hole,
wherein the insulating layer fills the first via hole having the first penetration wiring formed therein;
wherein the second penetrating wiring is integrally formed with the wiring layer on the first surface to fill the second via hole.

7. The semiconductor package as claimed in claim 1, wherein a thickness of the second sealing insulating layer is the same as a thickness of a wiring substrate including the first sealing insulating layer, the wiring layer, and the insulating layer.

8. The semiconductor package as claimed in claim 1, wherein the resin of the first sealing insulating layer and the resin of the second sealing insulating layer have a thermosetting property.

9. The semiconductor package as claimed in claim 2, wherein the resin of the first sealing insulating layer and the resin of the second sealing insulating layer have a thermosetting property.

\* \* \* \* \*